United States Patent
Nozaki et al.

(10) Patent No.: US 11,451,010 B2
(45) Date of Patent: Sep. 20, 2022

(54) SEMICONDUCTOR LASER ELEMENT

(71) Applicant: PANASONIC CORPORATION, Osaka (JP)

(72) Inventors: Shinichiro Nozaki, Osaka (JP); Takuma Katayama, Kyoto (JP)

(73) Assignee: PANASONIC HOLDINGS CORPORATION, Osaka (JP)

( * ) Notice: Subject to any disclaimer, the term of this patent is extended or adjusted under 35 U.S.C. 154(b) by 248 days.

(21) Appl. No.: 16/641,981

(22) PCT Filed: Aug. 2, 2018

(86) PCT No.: PCT/JP2018/029031
§ 371 (c)(1),
(2) Date: Feb. 25, 2020

(87) PCT Pub. No.: WO2019/044355
PCT Pub. Date: Mar. 7, 2019

(65) Prior Publication Data
US 2020/0220331 A1 Jul. 9, 2020

(30) Foreign Application Priority Data
Aug. 30, 2017 (JP) .............................. JP2017-165422

(51) Int. Cl.
*H01S 5/343* (2006.01)
*H01S 5/042* (2006.01)
(Continued)

(52) U.S. Cl.
CPC ........ *H01S 5/34333* (2013.01); *H01S 5/0421* (2013.01); *H01S 5/22* (2013.01); *H01S 5/3063* (2013.01); *H01S 5/4025* (2013.01)

(58) Field of Classification Search
CPC ...... H01S 5/34333; H01S 5/0421; H01S 5/22; H01S 5/3063; H01S 5/4025
See application file for complete search history.

(56) References Cited

U.S. PATENT DOCUMENTS

| 5,834,326 A | 11/1998 | Miyachi et al. |
| 9,564,736 B1 * | 2/2017 | Hsu ..................... H01S 5/2031 |
| 2001/0017874 A1 | 8/2001 | Ishida |

FOREIGN PATENT DOCUMENTS

| JP | H04-088689 A | 3/1992 |
| JP | H09-162442 A | 6/1997 |

(Continued)

OTHER PUBLICATIONS

International Search Report and Written Opinion dated Oct. 23, 2018 in International Application No. PCT/JP2018/029031; with partial English translation.

(Continued)

*Primary Examiner* — Yuanda Zhang
(74) *Attorney, Agent, or Firm* — McDermott Will & Emery LLP

(57) ABSTRACT

A semiconductor light-emitting element includes: an n-type cladding layer formed of a nitride semiconductor; an active layer which is arranged above the n-type cladding layer and formed of a nitride semiconductor; a p-type cladding layer arranged above the active layer and formed of a nitride semiconductor; and a p-side electrode arranged above the p-type cladding layer, wherein the p-type cladding layer contains hydrogen, and a first concentration of the hydrogen at a center of the p-type cladding layer in a region below the p-side electrode is lower than a second concentration of the hydrogen at a position located on a side closer to an outer edge than to the center in the region below the p-side electrode.

14 Claims, 14 Drawing Sheets

(51) Int. Cl.
*H01S 5/22* (2006.01)
*H01S 5/40* (2006.01)
*H01S 5/30* (2006.01)

(56) References Cited

FOREIGN PATENT DOCUMENTS

| | | |
|---|---|---|
| JP | 2001-298214 A | 10/2001 |
| JP | 2008-235396 A | 10/2008 |
| JP | 2010-034246 A | 2/2010 |
| JP | 2017-017172 A | 1/2017 |

OTHER PUBLICATIONS

Japanese Office Action dated Jun. 22, 2021 issued in the orresponding Japanese Patent Application No. 2019-539108.
Japanese Notice of Reasons for Refusal dated Sep. 21, 2021, issued in the corresponding Japanese Patent Application No. 2019-539108; with English translation.

\* cited by examiner

SEMICONDUCTOR LASER ELEMENT

CROSS-REFERENCE OF RELATED APPLICATIONS

This application is the U.S. National Phase under 35 U.S.C. § 371 of International Patent Application No. PCT/JP2018/029031, filed on Aug. 2, 2018, which in turn claims the benefit of Japanese Application No. 2017-165422, filed on Aug. 30, 2017, the entire disclosures of which Applications are incorporated by reference herein.

TECHNICAL FIELD

This disclosure relates to a semiconductor light-emitting element and more specifically to a semiconductor light-emitting element involved in emission in a visible region from blue-violet to red.

The present application is a patent application subject to Industrial Technology Enhancement Act, Article 19 on a sponsored research "Development of advanced laser processing with intelligence based on high-brightness and high-efficiency laser technologies/Development on GaN-based high-power high-beam quality semiconductor lasers for highly-efficient laser processing" FY2016 Annual Report conducted by New Energy and Industrial Technology Development Organization.

BACKGROUND ART

Semiconductor light-emitting elements such as semiconductor lasers have been conventionally considered as light sources with high output and high efficiency used for projectors, etc. (for example, Patent Literature (PTL) 1). When high output operation is performed in the semiconductor light-emitting element, it is possible that the temperature of the element located near a light-emitting part increases while the power conversion efficiency of the semiconductor light-emitting element deteriorates. To solve such a problem, a plurality of insulating layers of a stripe shape are provided in a waveguide of the semiconductor laser element in PTL 1. Consequently, a current at the central part of a waveguide can be reduced, which permits an improvement in temperature distribution in the waveguide. Attempts to improve the power conversion efficiency of the semiconductor laser element is made through the improvement in the temperature distribution in the waveguide as described above in PTL 1.

CITATION LIST

Patent Literature

PTL 1: Japanese Unexamined Patent Application Publication No. 114-88689

SUMMARY OF THE INVENTION

Technical Problem

However, in the semiconductor laser element disclosed in PTL 1, a contact area between a semiconductor layer and a p-side electrode is reduced as a result of providing the insulating layers in the waveguide. Thus, the contact resistance between the p-side electrode and the semiconductor layer increases. Thus, a voltage drop in the contact resistance increases, thus deteriorating the power conversion efficiency of the semiconductor laser element.

The present disclosure solves such a problem and is intended to provide a semiconductor light-emitting element with high power conversion efficiency.

Solutions to Problem

To solve the problem described above, a semiconductor light-emitting element according to one aspect of the present disclosure includes: an n-type cladding layer formed of a nitride semiconductor; an active layer which is arranged above the n-type cladding layer and formed of a nitride semiconductor; a p-type cladding layer which is arranged above the active layer and formed of a nitride semiconductor; and a p-side electrode arranged above the p-type cladding layer, wherein the p-type cladding layer contains hydrogen, and a first a concentration of the hydrogen at a center of the p-type cladding layer in a region below the p-side electrode is lower than a second concentration of the hydrogen at a position located on a side closer to an outer edge than to the center in the region below the p-side electrode.

With such a configuration, the hydrogen concentration at the center in the region corresponding to a waveguide of the p-type cladding layer is reduced, which can reduce the binding between the dopant such as Mg and the hydrogen at the center in the region corresponding to the waveguide, thus permitting suppression of a resistance increase at the position corresponding to the central part of the waveguide of the p-type cladding layer. Moreover, reducing the hydrogen concentration of the p-type cladding layer at the position corresponding to the central part of the waveguide in particular can reduce the resistance at the central portion of the p-type cladding layer in particular. Thus, Joule heat generated at the central portion of the p-type cladding layer whose temperature tends to become maximum can be reduced, which can uniformize the temperature distribution in the waveguide. That is, the maximum temperature in the waveguide can be reduced. Therefore, it is possible to suppress deterioration in the power conversion efficiency attributable to the temperature increase in the semiconductor light-emitting element.

Moreover, in one aspect of the semiconductor light-emitting element according to the present disclosure, a third concentration of the hydrogen in a region of the p-type cladding layer other than the region below the p-side electrode may be higher than the second concentration.

With such a configuration, the hydrogen concentration of the p-type cladding layer outside of the waveguide becomes higher than the hydrogen concentration of the p-type cladding layer inside of the waveguide. Thus, the ratio of the dopant such as Mg deactivated through binding with the hydrogen at the p-type cladding layer outside of the waveguide increases. That is, the resistance of the p-type cladding layer outside of the waveguide increases, so that a current flowing to the outside of the waveguide decreases. Therefore, it is possible to enclose the current inside of the waveguide.

Moreover, in one aspect of the semiconductor light-emitting element according to the present disclosure, further included may be an insulating layer which is arranged above the p-type cladding layer and has an opening, wherein the p-side electrode may be arranged at least in the opening, and the region below the p-side electrode may be a region located below a portion of the p-side electrode arranged in the opening.

With such a configuration, the region located below in a portion of the p-side electrode arranged in the opening serves as a region corresponding to the waveguide of the p-type cladding layer.

Moreover, in one aspect of the semiconductor light-emitting element according to the present disclosure, further included may be a contact layer which is arranged above the p-type cladding layer and formed of a nitride semiconductor, wherein the insulating layer may be arranged above the contact layer, and the p-side electrode may be in contact with the contact layer in the opening.

Moreover, in one aspect of the semiconductor light-emitting element according to the present disclosure, the p-type cladding layer may have a ridge part, the opening may be arranged above the ridge part, and the p-side electrode may be arranged above the ridge part.

Consequently, it is possible to stably enclose light generated at the active layer in a direction perpendicular to the resonance direction. Therefore, it is possible to stabilize the intensity distribution of the light outputted from the semiconductor light-emitting element in a direction long a cross section.

Moreover, in one aspect of the semiconductor light-emitting element according to the present disclosure, further included may be a contact layer which is arranged above the ridge part and formed of a nitride semiconductor, wherein the p-side electrode may be in contact with the contact layer in the opening.

Moreover, one aspect of a semiconductor light-emitting element according to the present disclosure includes a substrate; and an array part having three or more light-emitting element parts which are arrayed in parallel to a main surface of the substrate above the main surface and each of which emits light, wherein each of the three or more light-emitting element parts includes: on the substrate, an n-type cladding layer formed of a nitride semiconductor, an active layer formed of a nitride semiconductor, and a p-type cladding layer formed of a nitride semiconductor, which are arranged in stated order from closest to furthest from the substrate, the p-type cladding layer contains hydrogen, and a concentration of the hydrogen in the p-type cladding layer of the light-emitting element part included in the three or more light emitting element parts and located on a side closer to a center of the array part is lower than a concentration of the hydrogen in the p-type cladding layer of the light-emitting element part included in the three or more light emitting element parts and located on a side closer to an end part of the array part than the light-emitting element part included in the three or more light emitting element parts and located on the side closer to the center of the array part.

As described above, in the semiconductor light-emitting element including the array part having three or more light-emitting element parts, the temperature of the light-emitting element part located on the side closer to the center of the array part tends to become higher than the temperatures of the light-emitting element parts located on the sides closer to the end parts of the array part. However, having the configuration as described above in the semiconductor light-emitting element according to the present disclosure makes it possible to reduce the resistance of the p-type cladding layer located on the side closer to the center of the array part, thus permitting a reduction in the Joule heat generated in the light-emitting element part located on the side closer to the center of the array part during operation of the semiconductor light-emitting element. Therefore, it is possible to suppress deterioration in the power conversion efficiency of the light-emitting element part located on the side closer to the center of the array part.

Moreover, in another aspect of a semiconductor light-emitting element according to the present disclosure, a contact layer arranged above the ridge part and formed of a nitride semiconductor may be further provided, and the p-side electrode may be in contact with the contact layer in the opening.

Advantageous Effect of Invention

The present disclosure can provide a semiconductor light-emitting element with high power conversion efficiency.

DESCRIPTION OF EXEMPLARY EMBODIMENTS

Figure 1:
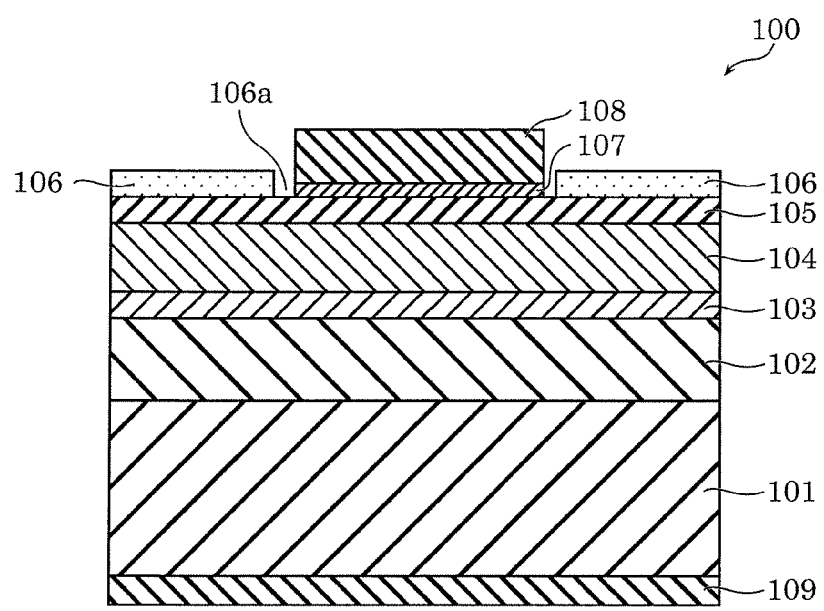
FIG. 1 is a schematic sectional view illustrating an overall configuration of a semiconductor light-emitting element according to Embodiment 1.

Hereinafter, the embodiments of the present disclosure will be described with reference to the drawings. Note that each of the embodiments described below illustrates one detailed preferable example of the present disclosure. Therefore, numerical values, shapes, materials, components, and arrangement positions and connection modes of the components illustrated in the embodiments below form one example and are not intended to limit the present disclosure in any manner. Therefore, of components in the embodiments described below, those not described in an independent claim indicating the most generic concept of the present disclosure will be described as optional components.

Moreover, each drawing is a schematic diagram and does not necessarily provide precise illustration. Therefore, scales etc. do not always match in the drawings. Note that substantially the same configuration is provided with the same mark in the drawings and overlapping description will be omitted or simplified.

Moreover, terms "above" and "below" in the description do not indicate upward (vertically upward) and downward (vertically downward) in absolute spatial recognition but are used as terms defined by relative positional relationship based on lamination order in a lamination configuration. Moreover, terms "above" and "below" are applicable not only to a case where another component is present between two components so arranged as to be spaced from each other but also to a case where two components are arranged in contact with each other.

Embodiment 1

A semiconductor light-emitting element according to Embodiment 1 will be described.

[1-1. Overall Configuration]

First, the overall configuration of the semiconductor light-emitting element according to the present embodiment will be described with reference to the drawing. FIG. 1 is a schematic sectional view illustrating the overall configuration of semiconductor light-emitting element 100 according to the present embodiment.

Semiconductor light-emitting element 100 is a light-emitting element including a nitride semiconductor layer. In the present embodiment, semiconductor light-emitting element 100 is a semiconductor laser element which has two end surfaces forming a resonator. FIG. 1 illustrates a cross section perpendicular to a resonance direction of semiconductor light-emitting element 100.

As illustrated in FIG. 1, semiconductor light-emitting element 100 includes: substrate 101, n-type cladding layer 102, active layer 103, p-type cladding layer 104, contact layer 105, insulating layer 106, p-side electrode 107, pad electrode 108, and n-side electrode 109.

Substrate 101 is a base material of semiconductor light-emitting element 100. Substrate 101 is a GaN single crystal substrate in the present embodiment. Substrate 101 is not limited to the GaN single crystal substrate and may be any substrate on which a nitride semiconductor layer can be laminated. For example, substrate 101 may be a SiC substrate or a sapphire substrate.

N-type cladding layer 102 is a cladding layer which is arranged above substrate 101 and formed of an n-type nitride semiconductor. N-type cladding layer 102 is an $Al_xGa_{1-x}N$ (x=0.03) layer with a film thickness of 3 μm and with Si doped in the present embodiment. Si concentration in n-type cladding layer 102 is $1\times10^{17}$ cm$^{-3}$. The configuration of n-type cladding layer 102 is not limited to the aforementioned configuration. N-type cladding layer 102 may be an $Al_xGa_{1-x}N$ (0<x<1) layer having a film thickness of 1 μm or more.

Active layer 103 is a light-emitting layer which is arranged above n-type cladding layer 102 and formed of a nitride semiconductor. Active layer 103 in the present embodiment includes a quantum well active layer in which two well layers formed of $In_xGa_{1-x}N$ (x=0.06) with a film thickness of 5 nm and two barrier layers formed of GaN with a film thickness of 10 nm are alternately laminated. The configuration of active layer 103 is not limited to the aforementioned configuration. Active layer 103 may be a quantum well active layer in which a well layer formed of $In_xGaN$ (0<x<1) and a barrier layer formed of $Al_xIn_yGa_{1-x-y}N$ (x≥0, y≥0) are alternately laminated. Note that active layer 103 may include a guide layer formed on at least either one of a top and a bottom of the quantum well active layer.

P-type cladding layer 104 is a cladding layer which is arranged above active layer 103 and formed of a p-type nitride semiconductor. P-type cladding layer 104 contains hydrogen. The first concentration of the hydrogen at the center of p-type cladding layer 104 in a region below p-side electrode 107 is lower than the second concentration of the hydrogen at a position located on a side closer to an outer edge than to the center in the region below p-side electrode 107. Here, the region below p-side electrode 107 means a region located immediately below p-side electrode 107. That is, the region below p-side electrode 107 means a region included in a region on a side closer to substrate 101 and overlapping p-side electrode 107 in a plan view of substrate 101. The hydrogen concentration in p-type cladding layer 104 will be described later on.

In the present embodiment, p-type cladding layer 104 includes an AlGaN/GaN superlattice layer with a film thickness of 3 μm and with Mg doped. The Mg concentration in p-type cladding layer 104 is $1\times10^{19}$ cm$^{-3}$. The AlGaN/GaN superlattice layer is a layer whose average Al composition is 3% and in which 100 AlGaN layers with a film thickness of 3 nm and 100 GaN layers with a film thickness of 3 nm are alternately laminated. The configuration of p-type cladding layer 104 is not limited to the aforementioned configuration. P-type cladding layer 104 may be a p-type $Al_xGa_{1-x}N$ (0<x<1) layer with a film thickness of 1 μm or more and with Mg doped.

Contact layer 105 is a layer which is arranged above p-type cladding layer 104 and formed of a p-type nitride semiconductor. In the present embodiment, contact layer 105 is a GaN layer with a film thickness of 5 nm and with Mg doped. The Mg concentration in contact layer 105 is $1\times10^{20}$ cm$^{-3}$. The configuration of contact layer 105 is not limited to the aforementioned configuration. Contact layer 105 may be a p-type GaN-based layer such as a p-type GaN layer or a p-type InGan layer.

Insulating layer 106 is a layer which is arranged above the p-type cladding layer 104 and formed of an insulating material having opening 106a. In the present embodiment, insulating layer 106 is a layer which is arranged above contact layer 105 and formed of $SiO_2$ with a film thickness of 200 nm, and has opening 106a at the center. Opening 106a is a through hole or a slot-shaped portion formed in insulating layer 106. The configuration of insulating layer 106 is not limited to the aforementioned configuration. Insulating layer 106 may be a layer which has opening 106a at the center and formed of an insulating material with a film thickness of 100 nm or more and 500 nm or less.

P-side electrode 107 is a layer which is arranged above p-type cladding layer 104 and formed of a conductive material. P-side electrode 107 is arranged in opening 106a of insulating layer 106. P-side electrode 107 is in contact with contact layer 105 in opening 106a. In the present embodiment, p-side electrode 107 is a laminated layer in which Pd and Pt are laminated in stated order from closest to furthest from contact layer 105. The configuration of p-side electrode 107 is not limited to the aforementioned configuration. P-side electrode 107 may be, for example, a single layer or a multilayer which is formed with at least one of Cr, Ti, Ni, Pd, Pt, and Au.

Pad electrode 108 is a pad-shaped electrode which is arranged above p-side electrode 107. In the present embodiment, pad electrode 108 is a laminated film in which Ti and Au are laminated in stated order from closest to furthest from p-side electrode 107. The configuration of pad electrode 108 is not limited to the aforementioned configuration. Pad electrode 108 may be a laminated film of, for example, Ti and Au, Ti, Pt, and Au, or Ni and Au.

N-side electrode 109 is an electrode which is arranged below substrate 101. In the present embodiment, n-side electrode 109 is a laminated film in which Ti, Pt, and Au are laminated in stated order from closest to furthest from substrate 101. The configuration of n-side electrode 109 is not limited to the aforementioned configuration. N-side electrode 109 may be a laminated film of, for example, Ti and Au or Ti, Pt, and Au.

[1-2. Hydrogen Concentration in P-Type Cladding Layer]

Figure 2:
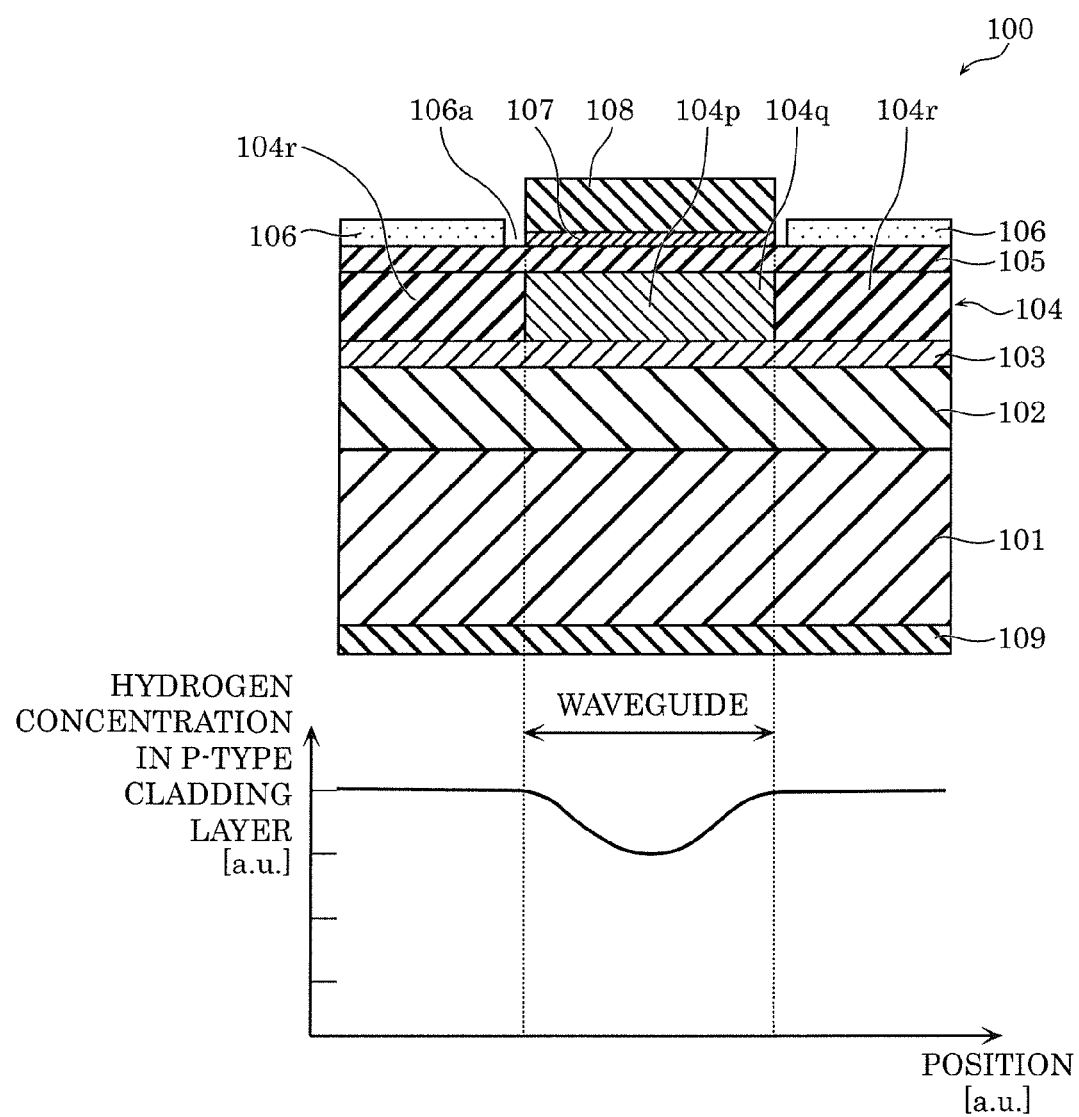
FIG. 2 is a graph schematically illustrating hydrogen concentration distribution in a p-type cladding layer of the semiconductor light-emitting element according to Embodiment 1.

Next, the hydrogen concentration in p-type cladding layer 104 according to the present embodiment will be described with reference to the drawing. FIG. 2 is a graph schematically illustrating the hydrogen concentration distribution in p-type cladding layer 104 of semiconductor light-emitting element 100 according to the present embodiment. FIG. 2 also illustrates a schematic sectional view of semiconductor light-emitting element 100 for the purpose of indicating relationship between a position in p-type cladding layer 104 and the hydrogen concentration.

The hydrogen contained in p-type cladding layer 104 is mainly captured at time of crystal growth of p-type cladding layer 104. A hydrogen atom captured into p-type cladding layer 104 can be bound with Mg that is dropped as a p-type dopant. Mg is deactivated by being bound with the hydrogen and can no longer generate carriers as the dopant. Thus, when the hydrogen concentration in p-type cladding layer 104 is high, the carrier density decreases, and the resistance of p-type cladding layer 104 increases. When the resistance of p-type cladding layer 104 is increased as described above, power loss due to a resistance component in p-type cladding layer 104 increases. Further, under the influence of an increase due to Joule heat attributable to the resistance component in p-type cladding layer 104, the power conversion efficiency of semiconductor light-emitting element 100 deteriorates. The temperature increase and the power conversion efficiency deterioration are remarkable at the central portion of a waveguide formed under p-side electrode 107 in particular.

In the present embodiment, optimizing the hydrogen concentration distribution in p-type cladding layer 104 suppresses the aforementioned resistance increase of p-type cladding layer 104 and the aforementioned temperature increase at the central part of the waveguide. More specifically, as illustrated in FIG. 2, the first concentration of the hydrogen at center 104p of p-type cladding layer 104 in the region below p-side electrode 107 is lower than the second concentration of the hydrogen at position 104q located on a side closer to the outer edge than to center 104p in the region below p-side electrode 107. As described above, the hydrogen concentration of p-type cladding layer 104 at the position corresponding to the central part of the waveguide is low and the hydrogen concentration of p-type cladding layer 104 at the position corresponding to the side closer to the outer edge of the waveguide is high. The first concentration may be, for example, $5 \times 10^{17}$ cm$^{-3}$ or less. Consequently, it is possible to reliably suppress the resistance increase of p-type cladding layer 104. Moreover, as illustrated in FIG. 2, the third concentration of the hydrogen in region 104r of p-type cladding layer 104 other than the region below p-side electrode 107 is higher than the second concentration. That is, the third concentration of the hydrogen in region 104r corresponding to the outside of the waveguide of p-type cladding layer 104 is higher than the second concentration.

As described above, reducing the hydrogen concentration of p-type cladding layer 104 at the center of the region corresponding to the waveguide makes it possible to reduce Mg and hydrogen binding at the center of the region corresponding to the waveguide, thus making it possible to suppress the resistance increase of p-type cladding layer 104 at the position corresponding to the central part of the waveguide. Moreover, reducing the hydrogen concentration of p-type cladding layer 104 at the position corresponding to the central part of the waveguide in particular makes it possible to reduce the resistance at the central portion of p-type cladding layer 104 in particular. Thus, Joule heat generated at the central portion of p-type cladding layer 104 the temperature of which tends to become highest can be reduced, which can uniformize the temperature distribution in the waveguide. That is, the highest temperature in the waveguide can be reduced. Therefore, the power conversion efficiency deterioration attributable to the temperature increase in semiconductor light-emitting element 100 can be suppressed.

A waveguide width in the region below p-side electrode 107 at opening 106a of insulating layer 106 in the present embodiment is 30 μm. Here, the waveguide width means a horizontal width of the waveguide in the sectional view of FIG. 2, that is, a width in a direction perpendicular to the resonance direction of semiconductor light-emitting element 100 and the thickness direction of p-side electrode 107. The waveguide width is not limited to 30 μm. The waveguide width may be 15 μm or more and 150 μm or less. Setting the waveguide width at 15 μm or more makes it possible to provide a sufficient difference in the hydrogen concentration in p-type cladding layer 104 for realizing the uniformization of the temperature distribution. Moreover, setting the waveguide width at 150 μm or less makes it possible to increase effect of enclosing a current and a light in the waveguide region.

Moreover, as described above, the third concentration of the hydrogen in region 104r of p-type cladding layer 104 other than the region below p-side electrode 107 is higher than the second concentration. As described above, the hydrogen concentration of p-type cladding layer 104 outside of the waveguide is higher than the hydrogen concentration of p-type cladding layer 104 inside of the waveguide. Thus, the ratio of Mg deactivated as a result of binding with the hydrogen in p-type cladding layer 104 outside of the waveguide increases. That is, the resistance of p-type cladding layer 104 outside of the waveguide increases, so that a current flowing to the outside of the waveguide decreases. Therefore, it is possible to enclose the current inside of the waveguide.

[1-3. Manufacturing Method]

Figure 3:
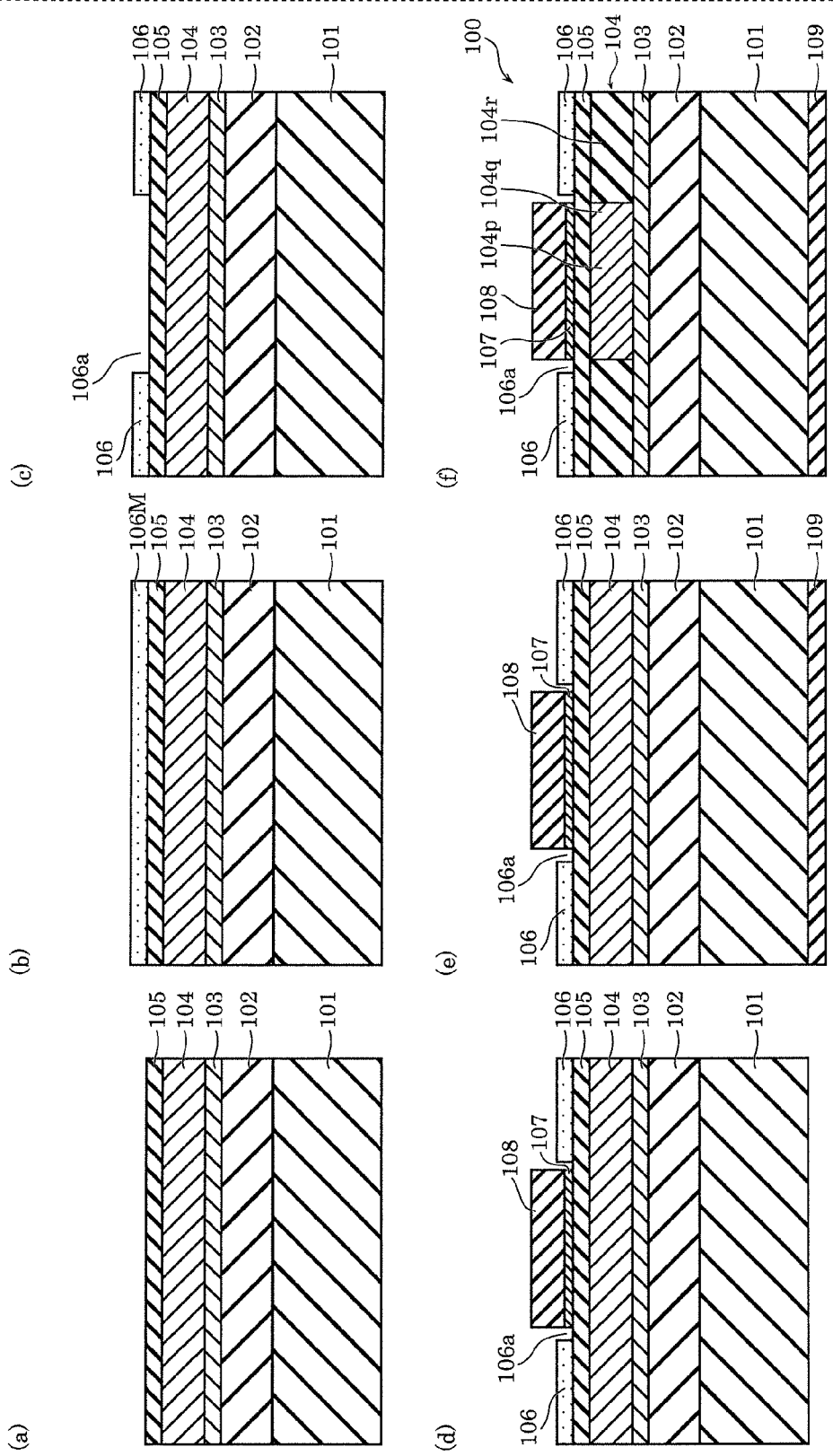
FIG. 3 is a schematic sectional view illustrating processes of a method for manufacturing the semiconductor light-emitting element according to Embodiment 1.

Next, a method for manufacturing semiconductor light-emitting element 100 according to the present embodiment will be described with reference to the drawing. FIG. 3 is a sectional view schematically illustrating processes of the method for manufacturing semiconductor light-emitting element 100 according to the present embodiment.

First, as illustrated in a sectional view (a) of FIG. 3, substrate 101 is prepared and n-type cladding layer 102, active layer 103, p-type cladding layer 104, and contact layer 105 are formed on substrate 101 in stated order from closest to furthest from the substrate 101. In the present embodiment, each of the layers is formed through metalorganic vapor phase epitaxy (MOCVD). Here, trimethyl aluminum (TMA) is used as a raw material of Al in the formation of p-type cladding layer 104 including the AlGaN/GaN superlattice layer. TMA is likely to absorb hydrogen, and thus the hydrogen contained in, for example, carrier gas is likely to be captured into the film upon the formation of the AlGaN layer. As a result of capturing the hydrogen into p-type cladding layer 104, the resistance of p-type cladding layer 104 increases as described above.

Next, as illustrated in a sectional view (b) of FIG. 3, insulating film 106M is formed above p-type cladding layer 104. In the present embodiment, insulating film 106M is formed on contact layer 105 formed on p-type cladding layer 104. For example, plasma CVD can be used for the formation of insulating film 106M. Subsequently, a laminated body including insulating film 106M illustrated in the sectional view (b) of FIG. 3 is annealed. In the present embodiment, the laminated body is annealed, for example, at 800 degrees Celsius for 30 minutes. Consequently, part of the binding between Mg and hydrogen contained in p-type cladding layer 104 can be cut. The binding between Mg and hydrogen which can be cut through the annealing occupies approximately 10% of the whole at a maximum, and the resistance increase of p-type cladding layer 104 cannot be sufficiently reduced.

Next, as illustrated in a sectional view (c) of FIG. 3, insulating film 106M having opening 106a is formed by removing part of insulating film 106M through, for example, wet etching.

Next, as illustrated in a sectional view (d) of FIG. 3, p-side electrode 107 and pad electrode 108 are formed in opening 106a of insulating film 106M in stated order from closest to furthest from contact layer 105 through, for example, vacuum vapor deposition.

Next, as illustrated in a sectional view (e) of FIG. 3, n-side electrode 109 is formed on a lower surface of substrate 101 (that is, a lower side surface of FIG. 3) through, for example, vacuum vapor deposition.

Next, a current is injected between pad electrode 108 and n-side electrode 109 while heating the laminated body formed through the processes as described above. In the present embodiment, for example, current injection with a current density of 15 kA/cm$^2$ is performed for 100 hours or longer while heating the laminated body to a temperature of 70 degrees Celsius or more. Consequently, the current intensively flows to p-type cladding layer 104 (that is, the region corresponding to the waveguide in p-type cladding layer 104) in the region below p-side electrode 107, which makes it possible to separate the hydrogen, which binds with Mg of p-type cladding layer 104 in the region below p-side electrode 107, from Mg. Moreover, the temperature of p-type cladding layer 104 at the central portion in the region below p-side electrode 107 in particular increases as a result of the current injection, which therefore permits the separation of a large amount of hydrogen from Mg at the aforementioned central portion. As described above, hydrogen concentration distribution as illustrated in FIG. 2 can be realized by reducing the hydrogen concentration in the region corresponding to the waveguide of p-type cladding layer 104.

Semiconductor light-emitting element 100 according to the present embodiment can be manufactured through the processes as described above.

Actually obtaining the hydrogen concentration distribution as illustrated in FIG. 2 through the processes as described above will be described with reference to experiment results.

Figure 4A:
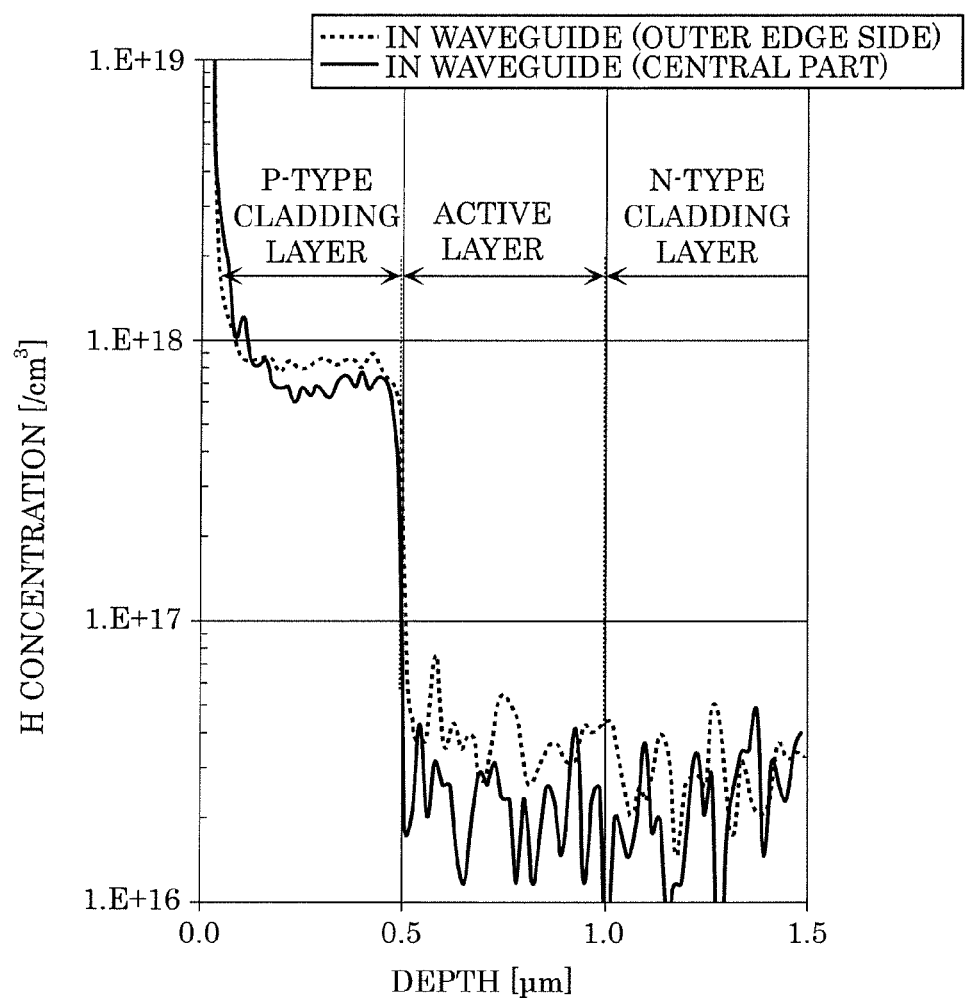
FIG. 4A is a graph illustrating hydrogen concentration distribution of an experimental element having the same configuration as that of the semiconductor light-emitting element according to Embodiment 1.

FIG. 4A is a graph illustrating the hydrogen concentration distribution of an experimental element having the same configuration as that of semiconductor light-emitting element 100 according to the present embodiment. FIG. 4A illustrates the hydrogen concentration distribution at a position corresponding to the center of a waveguide of the experimental element by a solid line and the hydrogen concentration distribution at a position of the waveguide on a side closer to the outer edge by a dotted line. A p-side electrode with a diameter of 300 µm is formed on the experimental element, and the hydrogen concentration distribution at the position corresponding to the center of the p-side electrode is indicated by the solid line and the hydrogen concentration distribution at the position on the side closer to the outer edge 100 µm from the center of the p-side electrode is indicated by the dotted line. With the experimental element, current injection with a current density of 15 kA/cm$^2$ was performed for 100 hours while heating to 70 degrees Celsius for the purpose of forming the same hydrogen concentration distribution as that of semiconductor light-emitting element 100 according to the present embodiment.

Figure 4B:
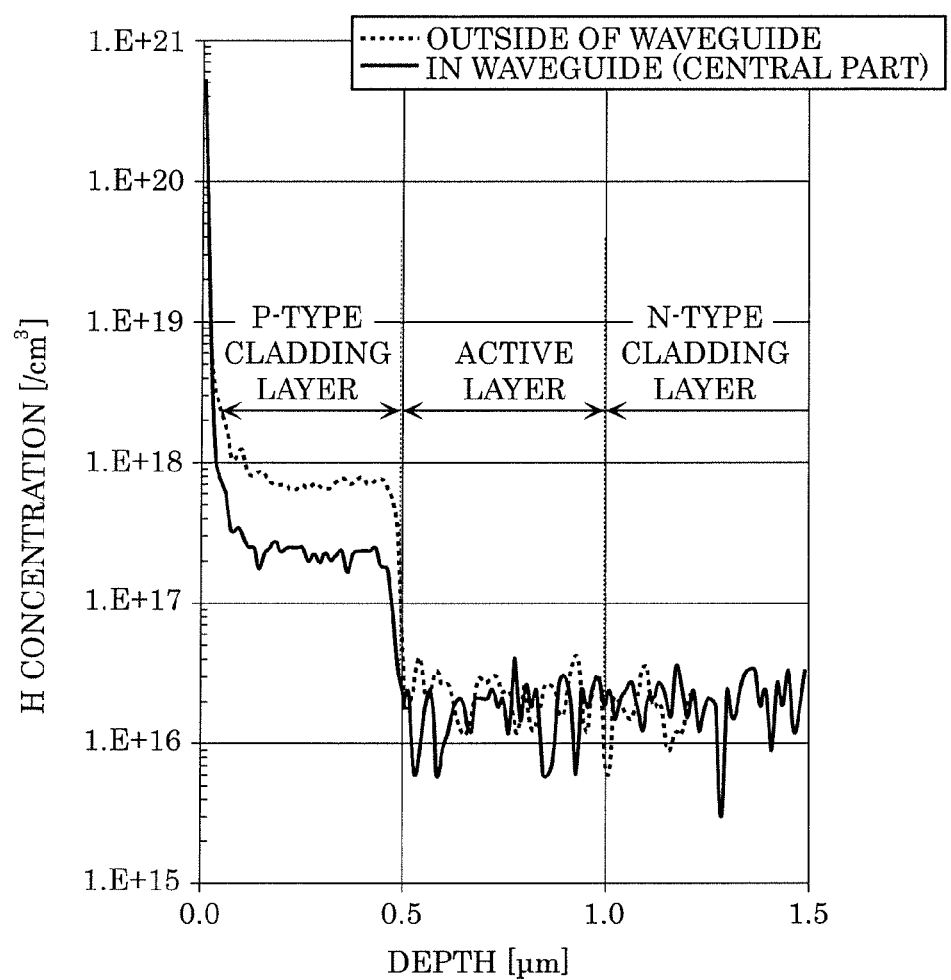
FIG. 4B is a graph illustrating hydrogen concentration distribution of another experimental element having the same configuration as that of the semiconductor light-emitting element according to Embodiment 1.

FIG. 4B is a graph illustrating the hydrogen concentration distribution of another experimental element having the same configuration as that of semiconductor light-emitting element 100 according to the present embodiment. FIG. 4B illustrates the hydrogen concentration distribution at a position corresponding to the center of a waveguide of the experimental element by a solid line and the hydrogen concentration distribution in a region outside of the waveguide by a dotted line. A p-side electrode with a diameter of 300 µm is formed on the experimental element, and the hydrogen concentration distribution at the position corresponding to the center of the p-side electrode is indicated by the solid line and the hydrogen concentration distribution at a position outside of the p-side electrode is indicated by the dotted line. With the experimental element, current injection with a current density of 15 kA/cm$^2$ is performed for 500 hours while heating to 70 degrees Celsius for the purpose of forming the same hydrogen concentration distribution as that of semiconductor light-emitting element 100 according to the present embodiment.

FIGS. 4A and 4B illustrate numerical values measured through secondary ion mass spectrometry (SIMS). Moreover, semiconductor light-emitting element 100 is heated by, for example, loading semiconductor light-emitting element 100 on a heater.

As illustrated in FIG. 4A, the hydrogen concentration of the p-type cladding layer at the position corresponding to the center of the waveguide is lower than the hydrogen concentration of the p-type cladding layer located on the side closer to the outer edge of the waveguide. In addition, as illustrated in FIG. 4B, the hydrogen concentration of the p-type cladding layer at the position corresponding to the center of the waveguide is remarkably lower than the hydrogen concentration in a region of the p-type cladding layer located outside of the waveguide. As illustrated in FIGS. 4A and 4B, it is found that the hydrogen concentration distribution as illustrated in FIG. 2 is provided through a process in which the aforementioned heating and current injection are performed simultaneously.

Note that a method for forming the hydrogen concentration distribution as that of p-type cladding layer 104 according to the present embodiment is not limited to the method described above. For example, the temperature employed at time of the heating may be higher than 70 degrees Celsius and the density of the current injected may be greater than 15 kA/cm². Moreover, the heating and the current injection may be performed while making light such as laser light and an electron beam incident on the center of the waveguide. Through the incidence of light or the electron beam as described above, separation of hydrogen from Mg can be promoted, which therefore permits formation of desired hydrogen concentration distribution in shorter time.

Embodiment 2

Next, a semiconductor light-emitting element according to Embodiment 2 will be described. The semiconductor light-emitting element according to the present embodiment has a ridge structure, which is a point different from semiconductor light-emitting element 100 according to Embodiment 1, and is identical to semiconductor light-emitting element 100 according to Embodiment 1 in other points. Hereinafter, the semiconductor light-emitting element according to the present embodiment will be described with reference to the drawing, focusing on the point different from semiconductor light-emitting element 100 according to Embodiment 1.

Figure 5:
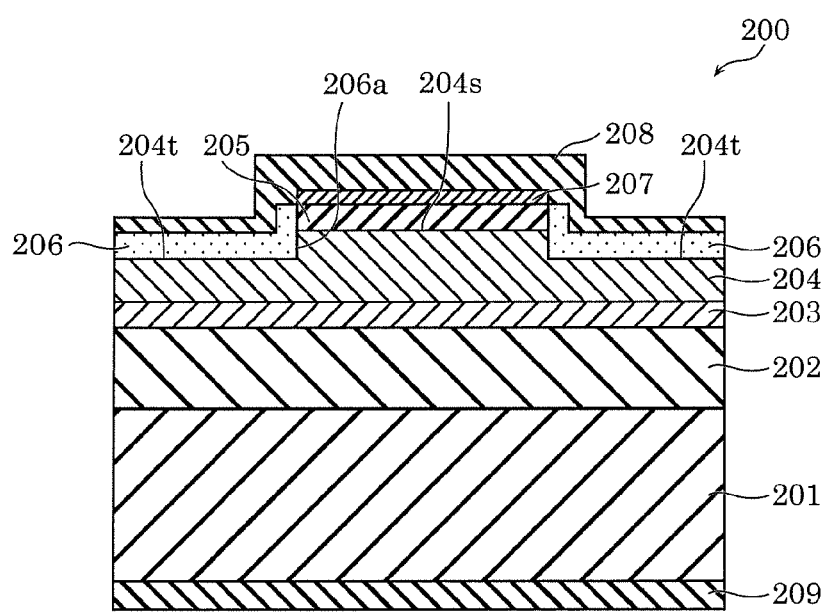
FIG. 5 is a schematic sectional view illustrating an overall configuration of a semiconductor light-emitting element according to Embodiment 2.

FIG. 5 is a sectional view schematically illustrating an overall configuration of semiconductor light-emitting element 200 according to the present embodiment. Semiconductor light-emitting element 200 according to the present embodiment is a semiconductor laser element which has two end surfaces forming a resonator. FIG. 5 illustrates a cross-section perpendicular to the resonance direction of semiconductor light-emitting element 200.

As illustrated in FIG. 5, semiconductor light-emitting element 200 includes: substrate 201, n-type cladding layer 202, active layer 203, p-type cladding layer 204, contact layer 205, insulating layer 206, p-side electrode 207, pad electrode 208, and n-side electrode 209.

Substrate 201, n-type cladding layer 202, active layer 203, and n-side electrode 209 respectively have the same configurations as those of substrate 101, n-type cladding layer 102, active layer 103, and n-side electrode 109 of semiconductor light-emitting element 100 according to Embodiment 1.

P-type cladding layer 204 is a cladding layer which is arranged above active layer 203 and formed of a p-type nitride semiconductor, as is the case with p-type cladding layer 104 according to Embodiment 1. In the present embodiment, p-type cladding layer 204 has: ridge part 204s; and flat parts 204t formed on both sides of ridge part 204s. That is, p-type cladding layer 204 is a layer which has a ridge structure formed on a layer formed of the same material as that of p-type cladding layer 104 according to Embodiment 1. P-type cladding layer 204 has: ridge part 204s extending in the resonance direction of semiconductor light-emitting element 200; and a portion with a small film thickness located adjacently to ridge part 204s. In the present embodiment, the width of ridge part 204s is 30 μm. The width of ridge part 204s is not limited to 30 μm and may be, for example, 10 μm and more and 150 μm or less.

Figure 6:
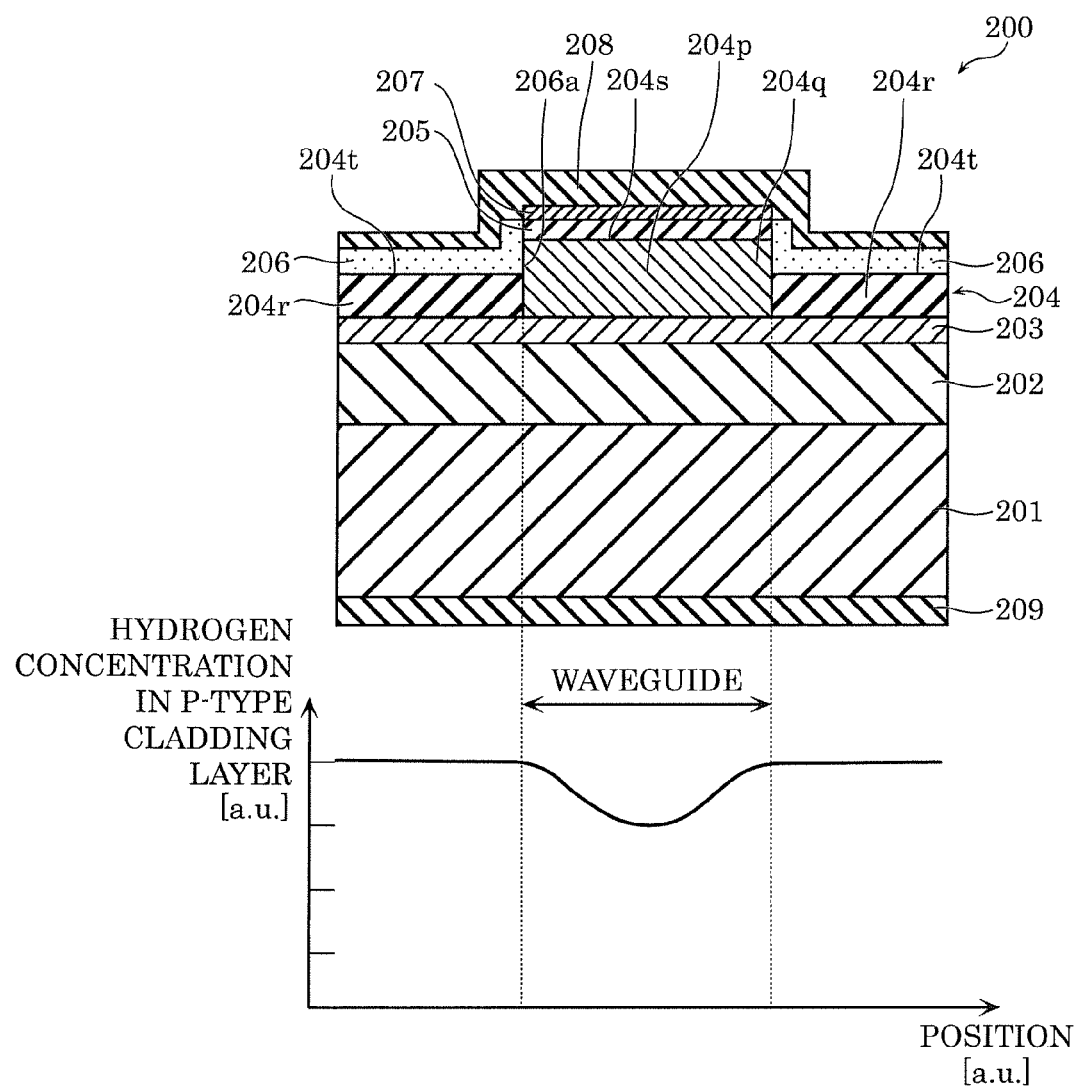
FIG. 6 is a graph schematically illustrating hydrogen concentration distribution of a p-type cladding layer according to Embodiment 2.

P-type cladding layer 204 has hydrogen. The hydrogen concentration distribution of p-type cladding layer 204 will be described with reference to the drawing. FIG. 6 is a graph schematically illustrating the hydrogen concentration distribution of p-type cladding layer 204 according to the present embodiment. FIG. 6 also illustrates a schematic sectional view of semiconductor light-emitting element 200 for the purpose of indicating relationship between a position in p-type cladding layer 204 and the hydrogen concentration.

As illustrated in FIG. 6, the first concentration of the hydrogen at center 204p of p-type cladding layer 204 in a region below p-side electrode 207 is lower than the second concentration of the hydrogen at position 204q located on a side closer to the outer edge than to the center in the region below p-side electrode 207. Moreover, the third concentration of the hydrogen in region 204r of p-type cladding layer 204 other than the region below p-side electrode 207 is higher than the second concentration. That is, the third concentration of the hydrogen in region 204r corresponding to the outside of a waveguide of p-type cladding layer 204 is higher than the second concentration.

Contact layer 205 is a layer which is arranged above p-type cladding layer 204 and formed of a p-type nitride semiconductor, as illustrated in FIG. 5. Contact layer 205 is arranged on ridge part 204s of p-type cladding layer 204.

The structures of p-type cladding layer 204 and contact layer 205 as described above are formed by, for example, selectively removing, through etching, part of the two layers formed of the same material as that of p-type cladding layer 104 and contact layer 105 according to Embodiment 1.

Insulating layer 206 is a layer which is arranged above p-type cladding layer 204 and formed of an insulating material having opening 206a, as illustrated in FIG. 5. Insulating layer 206 is a layer formed of the same material as that of insulating layer 106 according to Embodiment 1. In the present embodiment, insulating layer 206 is arranged on a portion on a top surface of p-type cladding layer 204 other than ridge part 204s, a side wall part of ridge part 204s, and a side surface of contact layer 205. That is, opening 206a is arranged above ridge part 204s. Insulating layer 206 is arranged above the side wall part of the ridge structure and the top surfaces of flat parts 204t of p-type cladding layer 204. Note that insulating layer 206 may be arranged above part of the top surface of contact layer 205. For example, insulating layer 206 is formed by removing, through etching, only the top surface portion of contact layer 205 in an insulating film formed on p-type cladding layer 204 and contact layer 205.

P-side electrode 207 is a layer which is arranged above p-type cladding layer 204 and formed of a conductive material. P-side electrode 207 is in contact with contact layer 205 in opening 206a of insulating layer 206. In the present embodiment, p-side electrode 207 is arranged above ridge part 204s and contact layer 205. The width of p-side electrode 207 is 30 μm, which is equal to the width of ridge part 204s. The width of p-side electrode 207 is not limited to 30 μm and thus may be, for example, 10 μm or more and 150 μm or less.

Pad electrode 208 is a pad-shaped electrode which is arranged above p-side electrode 207. In the present embodiment, pad electrode 208 is arranged above p-side electrode 207 and insulating layer 206. Consequently, an area of pad electrode 208 can be enlarged more than pad electrode 108 according to Embodiment 1, which makes it easy to connect a wire or the like to pad electrode 208.

Semiconductor light-emitting element 200 according to the present embodiment has the configuration as described above, thereby providing the same effect as the effect provided by semiconductor light-emitting element 100 according to Embodiment 1. Further, semiconductor light-emitting element 200 according to the present embodiment has the ridge structure, thereby making it possible to stably enclose light generated in active layer 203 in a direction perpendicular to the resonance direction. Therefore, the intensity distribution of light outputted from semiconductor light-emitting element 200 in a direction along the cross section can be stabilized.

Moreover, upon forming the hydrogen concentration distribution of p-type cladding layer 204, light generated following current injection can be stably enclosed in the ridge structure portion, which permits reduction in time required for forming the hydrogen concentration distribution.

Embodiment 3

Next, semiconductor light-emitting element according to Embodiment 3 will be described. The semiconductor light-emitting element according to the present embodiment includes two light-emitting element parts, that is, two waveguides, which is a point different from semiconductor light-emitting element 100 according to Embodiment 1, and is identical to semiconductor light-emitting element 100 according to Embodiment 1 in other points. Hereinafter, the semiconductor light-emitting element according to the present embodiment will be described with reference to the drawing, focusing on the point different from semiconductor light-emitting element 100 according to Embodiment 1.

Figure 7:
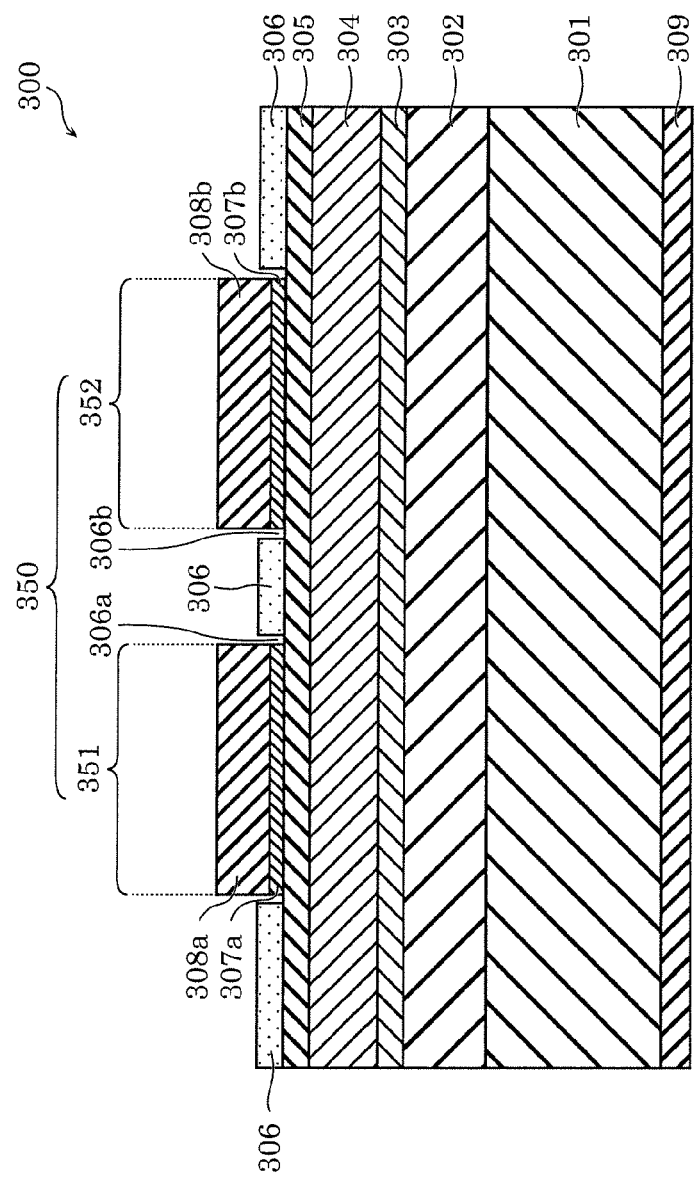
FIG. 7 is a schematic sectional view illustrating an overall configuration of a semiconductor light-emitting element according to Embodiment 3.

FIG. 7 is a sectional view schematically illustrating an overall configuration of semiconductor light-emitting element 300 according to the present embodiment. Semiconductor light-emitting element 300 according to the present embodiment is a semiconductor laser element which has two end surfaces forming a resonator. FIG. 7 illustrates a cross section perpendicular to the resonance direction of semiconductor light-emitting element 300.

As illustrated in FIG. 7, semiconductor light-emitting element 300 includes: substrate 301, insulating layer 306, n-side electrode 309, and array part 350 having two light-emitting element parts 351 and 352 which are arrayed above a main surface of substrate 301 in parallel to the main surface and each of which emits light.

Each of light-emitting element parts 351 and 352 has: n-type cladding layer 302 formed of a nitride semiconductor, active layer 303 formed of a nitride semiconductor, p-type cladding layer 304 formed of a nitride semiconductor, and contact layer 305, which are arranged in stated order from closest to furthest from substrate 301. Light-emitting element part 351 further includes p-side electrode 307a and pad electrode 308a. Light-emitting element part 352 further includes p-side electrode 307b and pad electrode 308b.

Substrate 301, n-type cladding layer 302, active layer 303, and contact layer 305 respectively have the same configurations as those of substrate 101, n-type cladding layer 102, active layer 103, and contact layer 105 according to Embodiment 1.

Insulating layer 306 is a layer which is arranged above p-type cladding layer 304 and formed of an insulating material having openings 306a and 306b. In the present embodiment, insulating layer 306 is arranged above contact layer 305. Openings 306a and 306b each have the same configuration as that of opening 106a according to Embodiment 1.

P-side electrodes 307a and 307b are layers which are arranged above p-type cladding layer 304 and formed of a conductive layer. In the present embodiment, p-side electrodes 307a and 307b are respectively arranged in openings 306a and 306b of insulating layer 306. P-side electrodes 307a and 307b each have the same configuration as that of p-side electrode 107 according to Embodiment 1. The width of each of p-side electrodes 307a and 307b is 30 µm. The width of each of p-side electrodes 307a and 307b is not limited to 30 µm and may be, for example, 10 µm or more and 150 µm or less.

Pad electrodes 308a and 308b are layers which are respectively arranged above p-side electrodes 307a and 307b and formed of a conductive material. Pad electrodes 308a and 308b each have the same configuration as that of pad electrode 108 according to Embodiment 1.

Figure 8:
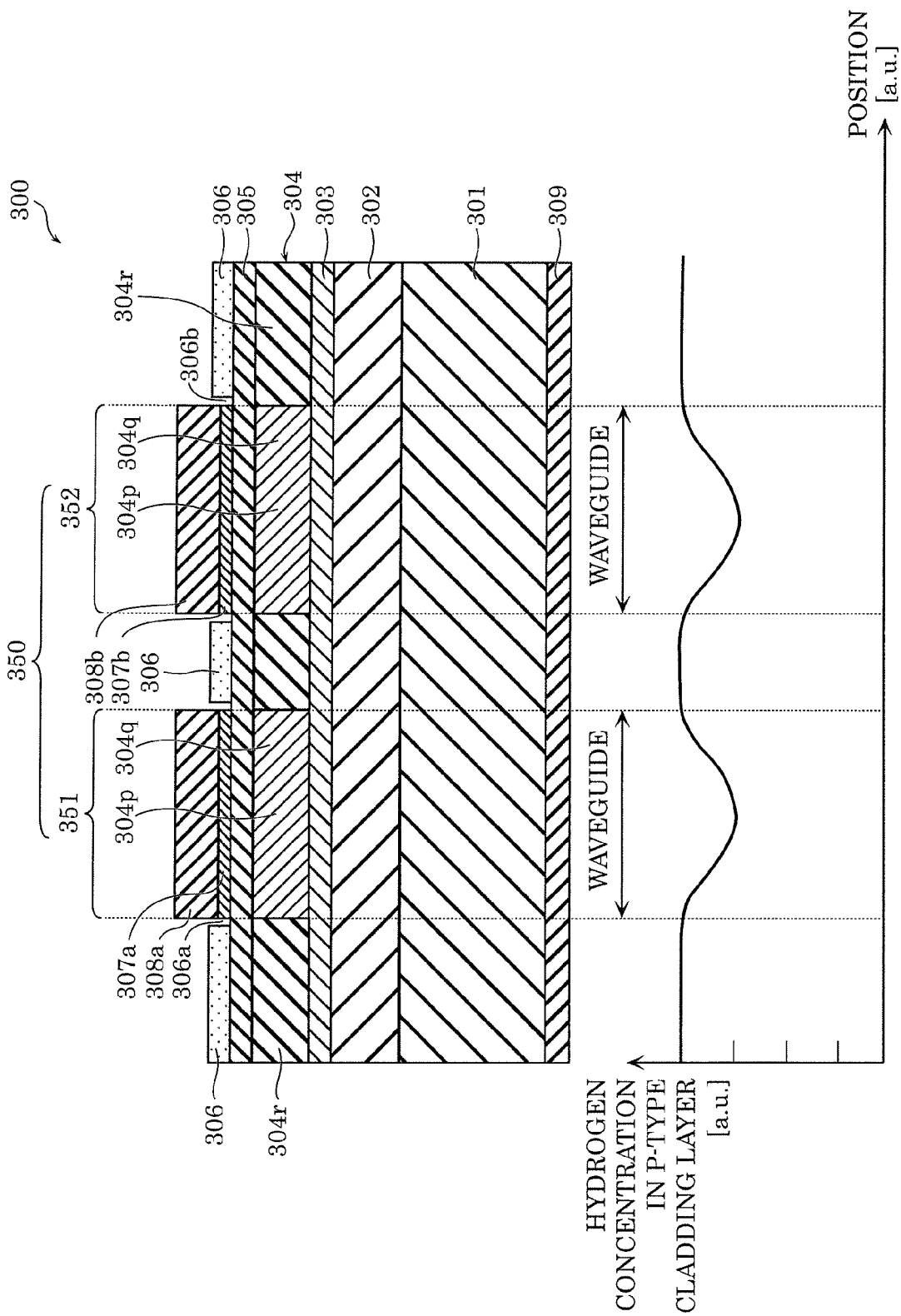
FIG. 8 is a graph schematically illustrating hydrogen concentration distribution of a p-type cladding layer according to Embodiment 3.

P-type cladding layer 304 is a layer which is arranged above active layer 303 and formed of a p-type nitride semiconductor. P-type cladding layer 304 contains hydrogen. The hydrogen concentration distribution of p-type cladding layer 304 will be described with reference to the drawing. FIG. 8 is a graph schematically illustrating the hydrogen concentration distribution of p-type cladding layer 304 according to the present embodiment. FIG. 8 also illustrates a schematic sectional view of semiconductor light-emitting element 300 for the purpose of indicating relationship between a position in p-type cladding layer 304 and the hydrogen concentration.

As illustrated in FIG. 8, the first concentration of the hydrogen at centers 304p of p-type cladding layer 304 in regions below p-side electrodes 307a and 307b is lower than the second concentration of the hydrogen at positions 304q located on sides closer to the outer edges than to the centers in the regions below p-side electrodes 307a and 307b. Moreover, the third concentration of the hydrogen at regions 304r of p-type cladding layer 304 other than the regions below p-side electrodes 307a and 307b is higher than the second concentration. That is, the third concentration of the hydrogen in regions 304r corresponding to the outside of waveguides of p-type cladding layer 304 is higher than the second concentration.

Semiconductor light-emitting element 300 according to the present embodiment has the configuration as described above, thereby providing the same effect as the effect provided by semiconductor light-emitting element 100 according to Embodiment 1. Further, semiconductor light-emitting element 300 according to the present embodiment has two light-emitting element parts 351 and 352 and thus can output light having a power twice the power of semiconductor light-emitting element 100.

Embodiment 4

Next, a semiconductor light-emitting element according to Embodiment 4 will be described. The semiconductor light-emitting element according to the present embodiment differs from semiconductor light-emitting element 300 according to Embodiment 3 in that the semiconductor light-emitting element according to the present embodiment has three light-emitting element parts and has different hydrogen concentration distribution of a p-type cladding layer, and is identical to semiconductor light-emitting element 300 according to Embodiment 3 in other points. Hereafter, the semiconductor light-emitting element according to the present embodiment will be described, focusing on the point different from semiconductor light-emitting element 300 according to Embodiment 3.

[4-1. Overall Configuration]

Figure 9:
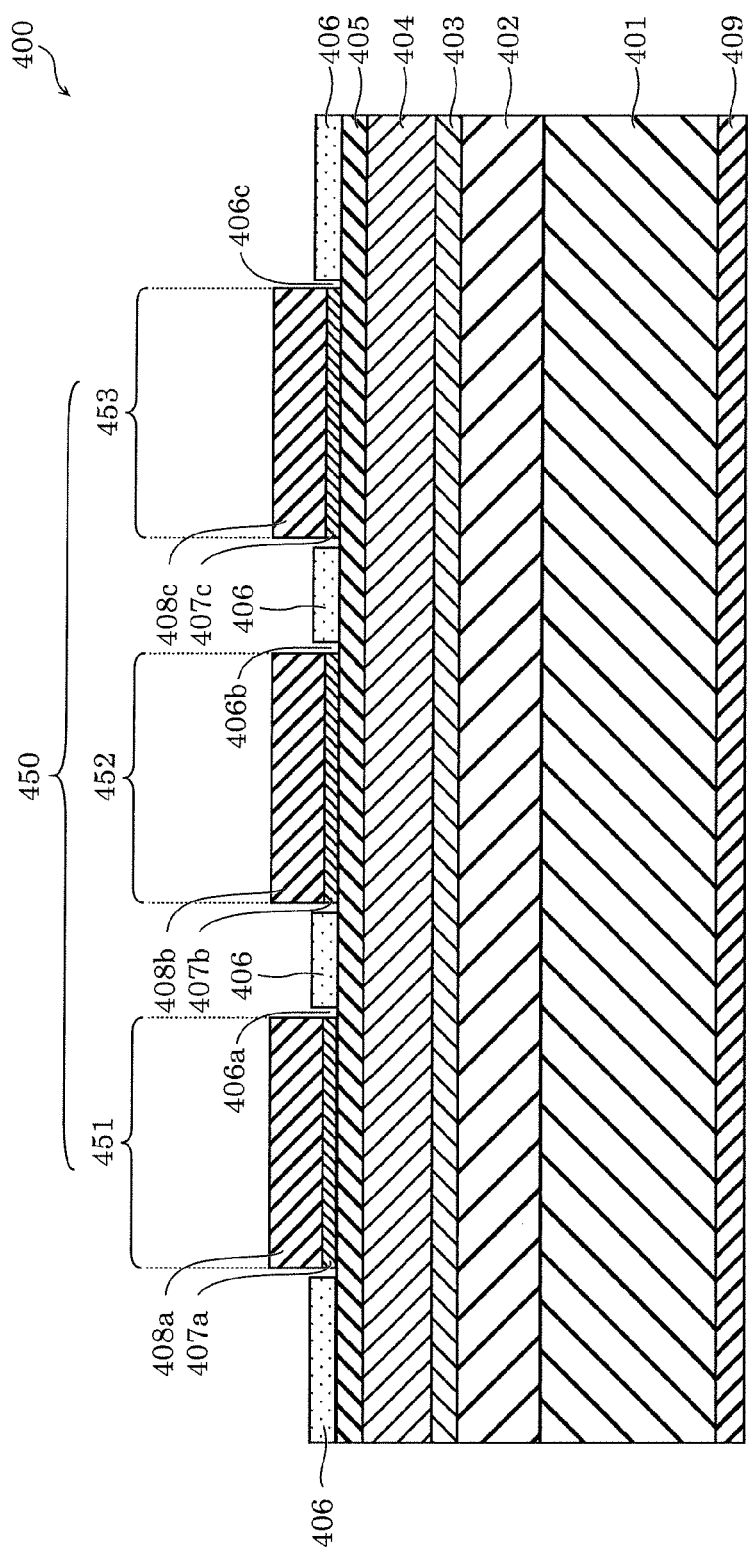
FIG. 9 is a schematic sectional view illustrating an overall configuration of a semiconductor light-emitting element according to Embodiment 4.

First, the overall configuration of semiconductor light-emitting element 400 according to the present embodiment will be described with reference to the drawing. FIG. 9 is a schematic sectional view illustrating the overall configuration of semiconductor light-emitting element 400 according to the present embodiment. Semiconductor light-emitting element 400 according to the present embodiment is a semiconductor laser element which has two end surfaces forming a resonator. FIG. 9 illustrates a cross section perpendicular to the resonance direction of semiconductor light-emitting element 400.

As illustrated in FIG. 9, semiconductor light-emitting element 400 includes: substrate 401, insulating layer 406, n-side electrode 409, and array part 450 having three light-emitting element parts 451, 452, and 453 which are arrayed above a main surface of substrate 401 in parallel to the main surface and each of which emits light.

Light-emitting element parts 451, 452, and 453 each have: n-type cladding layer 402 formed of a nitride semiconductor, active layer 403 formed of a nitride semiconductor, p-type cladding layer 404 formed of a nitride semiconductor, and contact layer 405 formed of a nitride semiconductor, which are arranged in stated order from closest to furthest from substrate 401. Light-emitting element part 451 further includes p-side electrode 407a and pad electrode 408a. Light-emitting element part 452 further includes p-side electrode 407b and pad electrode 408b. Light-emitting element part 453 further includes p-side electrode 407c and pad electrode 408c.

Substrate 401, n-type cladding layer 402, active layer 403, contact layer 405, and n-side electrode 409 respectively have the same configurations as those of substrate 301, n-type cladding layer 302, active layer 303, contact layer 305, and n-side electrode 309 according to Embodiment 3.

Insulating layer 406 is a layer which is arranged above p-type cladding layer 404 and formed of an insulating material having openings 406a, 406b, and 406c. In the present embodiment, insulating layer 406 is arranged above contact layer 405. Openings 406a, 406b, and 406c each have the same configuration as that of openings 306a and 306b according to Embodiment 3.

P-side electrodes 407a, 407b, and 407c are layers which are arranged above p-type cladding layer 404 and formed of a conductive material. P-side electrodes 407a, 407b, and 407c each have the same configuration as that of p-side electrodes 307a and 307b according to Embodiment 3. The width of each of p-side electrodes 407a, 407b, and 407c is 30 μm. The width of p-side electrodes 407a, 407b, and 407c is not limited to 30 μm and may be, for example, 10 μm or more and 150 μm or less.

Pad electrodes 408a, 408b, and 408c are layers which are respectively arranged above p-side electrodes 407a, 407b, and 407c and formed of a conductive material. Pad electrodes 408a, 408b, and 408c each have the same configuration as that of pad electrodes 308a and 308b according to Embodiment 3.

Figure 10:
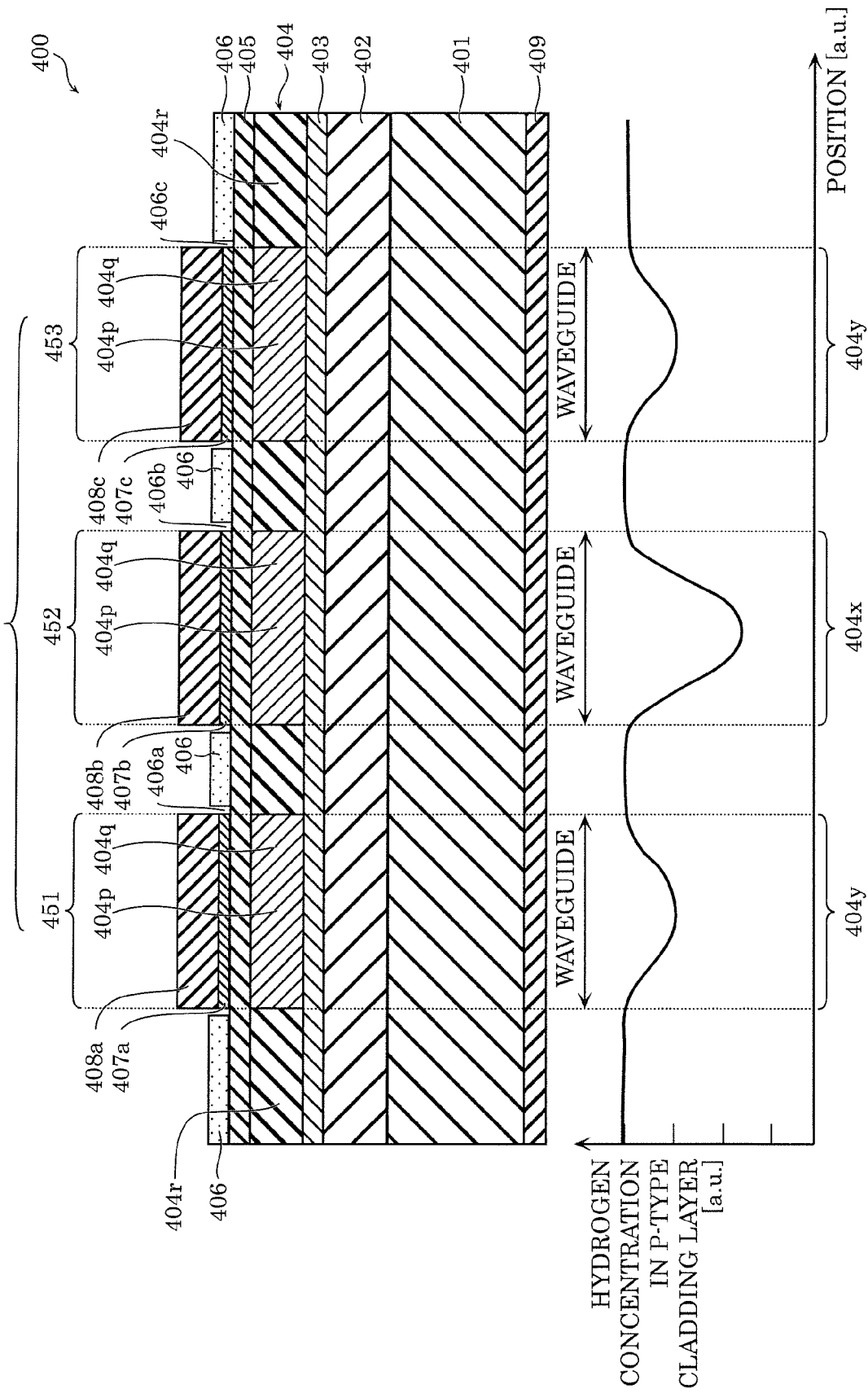
FIG. 10 is a graph schematically illustrating hydrogen concentration distribution of a p-type cladding layer according to Embodiment 4.

P-type cladding layer 404 is a cladding layer which is arranged above active layer 403 and formed of a p-type nitride semiconductor. P-type cladding layer 404 contains hydrogen. The hydrogen concentration distribution of p-type cladding layer 404 will be described with reference to the drawing. FIG. 10 is a graph schematically illustrating the hydrogen concentration distribution of p-type cladding layer 404 according to the present embodiment. FIG. 10 also illustrates a schematic sectional view of semiconductor light-emitting element 400 for the purpose of indicating relationship between a position in p-type cladding layer 404 and the hydrogen concentration.

As illustrated in FIG. 10, the first concentration of the hydrogen at centers 404p of p-type cladding layer 404 in regions respectively below p-side electrodes 407a, 407b, and 407c is lower than the second concentration of the hydrogen at positions 404q located on sides closer to the outer edges than to the centers in the regions respectively below p-side electrodes 407a, 407b, and 407c. Moreover, the third concentration of the hydrogen in regions 404r of p-type cladding layer 404 other than the regions respectively below p-side electrodes 407a, 407b, and 407c is higher than the second concentration. That is, the third concentration of the hydrogen in regions 404r corresponding to the outside of waveguides of p-type cladding layer 404 is higher than the second concentration. Consequently, semiconductor light-emitting element 400 according to the present embodiment provides the same effect as the effect provided by semiconductor light-emitting element 300 according to Embodiment 3.

Moreover, as illustrated in FIG. 10, light-emitting element part 452 located on the side closer to the center of array part 450 has a lower hydrogen concentration in p-type cladding layer 404 than light-emitting element parts 451 and 453 located on sides closer to the end parts of array part 450 than light-emitting element part 452. That is, the hydrogen concentration in portion 404x of p-type cladding layer 404 included in light-emitting element part 452 located on the side closer to the center of array part 450 is lower than the hydrogen concentration in portions 404y of p-type cladding layer 404 included in light-emitting element parts 451 and 453 located on the sides closer to the end parts of array part 450. Typically, in a semiconductor light-emitting element including an array part having three or more light-emitting element parts, heat generated in the light-emitting element part located on the side closer to the center of an array part is hardly diffused during operation. Thus, the temperature of the light-emitting element part located at the central part of the array part becomes higher than the temperatures of the light-emitting element parts located on sides closer to the end parts of the array part. Therefore, the power conversion efficiency of the light-emitting element part located at the central part of the array part becomes lower than the power conversion efficiency of the light-emitting element parts located on the sides closer to the end parts of the array part. In the present embodiment, p-type cladding layer 404 has the hydrogen concentration distribution as illustrated in FIG. 10 whereby the resistance of p-type cladding layer 404 located on a side closer to the center of array part 450 can be reduced, so that Joule heat generated in light-emitting element part 452 located on the side closer to the center of array part 450 can be reduced during operation of semiconductor light-emitting element 400. Therefore, the reduction in the power conversion efficiency of the light-emitting element part located at the central part of the array part can be suppressed.

[4-2. Manufacturing Method]

Figure 11:
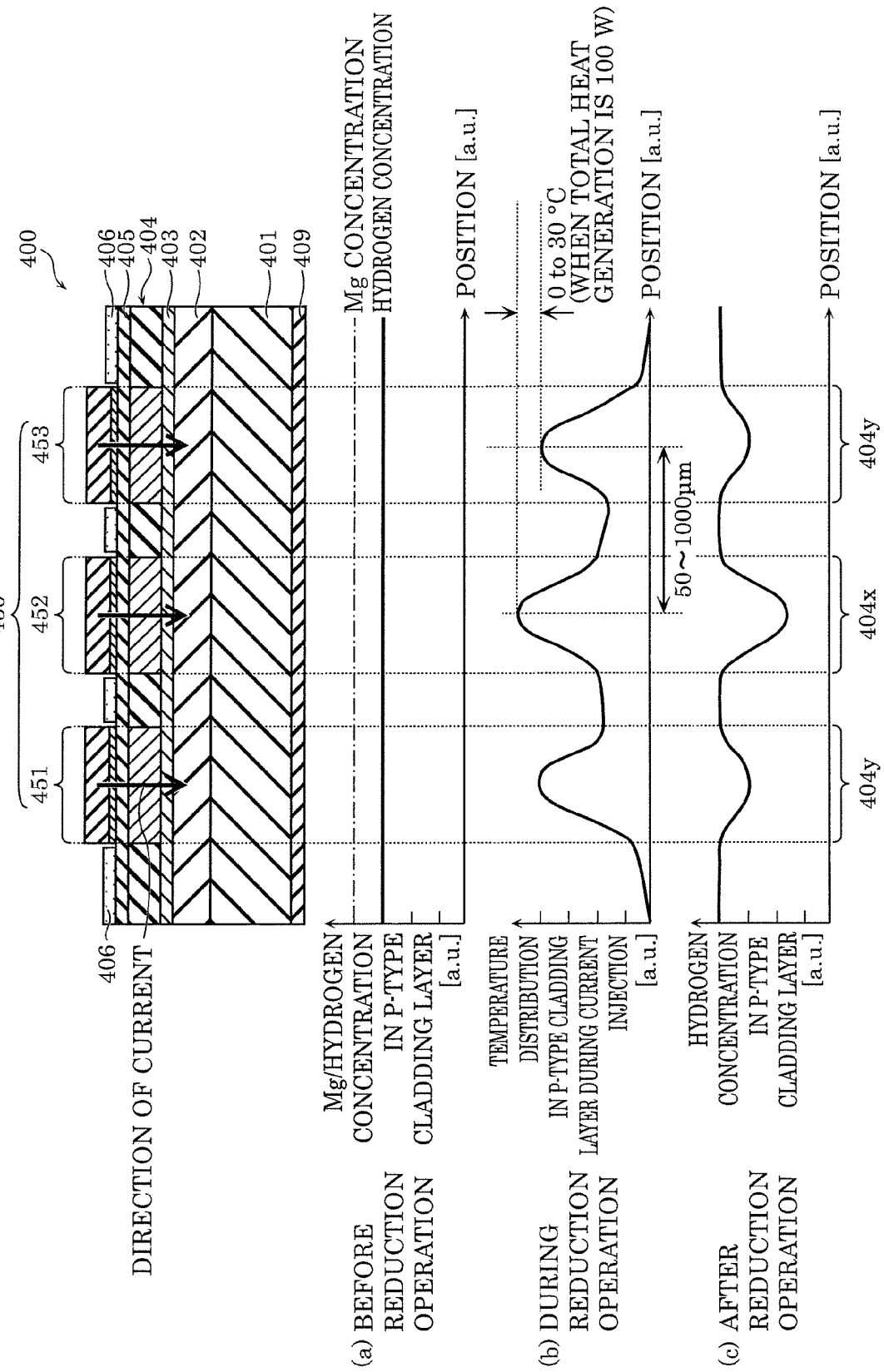
FIG. 11 is a diagram illustrating a hydrogen concentration reduction process of the semiconductor light-emitting element according to Embodiment 4.

Next, a process (hereinafter referred to as hydrogen concentration reduction process) of reducing the hydrogen concentration of p-type cladding layer 404 in the method for manufacturing semiconductor light-emitting element 400 according to the present embodiment will be described with reference to the drawing. FIG. 11 is a diagram illustrating the hydrogen concentration reduction process in semiconductor light-emitting element 400 according to the present embodiment. A graph (a) in FIG. 11 illustrates Mg and hydrogen concentration distribution in p-type cladding layer 404 before the hydrogen concentration reduction process. A graph (b) in FIG. 11 illustrates the temperature distribution in p-type cladding layer 404 during the hydrogen concentration reduction process. A graph (c) in FIG. 11 illustrates the hydrogen concentration distribution in p-type cladding layer 404 after the hydrogen concentration reduction process. FIG. 11 also illustrates a schematic sectional view of semiconductor light-emitting element 400 for the purpose of indicating relationship between, for example, a position in p-type cladding layer 404 and the hydrogen concentration.

Mg and hydrogen are uniformly distributed in p-type cladding layer 404 before the hydrogen concentration reduction process as illustrated in the graph (a) in FIG. 11. Heating and current injection are simultaneously performed on the element having such hydrogen concentration distribution in the hydrogen concentration reduction process in the same manner as in Embodiment 1, etc. At this point, the entire element is uniformly heated and the same level of current injection is performed at each of the light-emitting element parts. At this point, the current flows to each of the light-emitting element parts in the direction illustrated by an arrow in the sectional view of FIG. 11. Consequently, temperature distribution in p-type cladding layer 404 is provided as illustrated in the graph (b) in FIG. 11. As illustrated in the graph (b) in FIG. 11, the temperature of portion 404x of p-type cladding layer 404 included in light-emitting element part 452 located on the side closer to the center of array part 450 becomes higher than the temperature of portions 404y included in light-emitting element parts 451 and 453 located on the sides closer to the end parts of array part 450. A difference between the peak temperature of portion 404x in light-emitting element part 452 and the peak temperatures of portions 404y in light-emitting element parts 451 and 453 located on the sides closer to the end parts of array part 450 may be greater than 0 degrees Celsius and approximately 30 degrees Celsius or below. Such a temperature difference arises, for example, when the total amount of heat generated in array part 450 is approximately 100 W.

As a result of forming the temperature distribution as illustrated in the graph (b) of FIG. 11, the separation of the hydrogen from Mg is more promoted at portion 404x of p-type cladding layer 404 included in light-emitting element part 452 than in portions 404y of p-type cladding layer 404 included in light-emitting element parts 451 and 453. Therefore, the hydrogen concentration distribution as illustrated in the graph (c) of FIG. 11 is provided after the hydrogen concentration reduction process.

To realize the hydrogen distribution reduction as described above, inter-center distance between p-side electrode 407a, p-side electrode 407b, and p-side electrode 407c may be 50 μm or more and 1000 μm or less.

Note that, although not illustrated in the graph (c) of FIG. 11, the Mg concentration distribution is not changed by the hydrogen concentration reduction process.

Semiconductor light-emitting element 400 according to the present embodiment can be manufactured through the process as described below.

Embodiment 5

Next, a semiconductor light-emitting element according to Embodiment 5 will be described. The semiconductor light-emitting element according to the present embodiment has a ridge structure, which is a point different from semiconductor light-emitting element 400 according to Embodiment 4, and is identical to semiconductor light-emitting element 400 according to Embodiment 4 in other points. Hereinafter, the semiconductor light-emitting element according to the present embodiment will be described with reference to the drawing, focusing on the point different from semiconductor light-emitting element 400 according to Embodiment 4.

Figure 12:
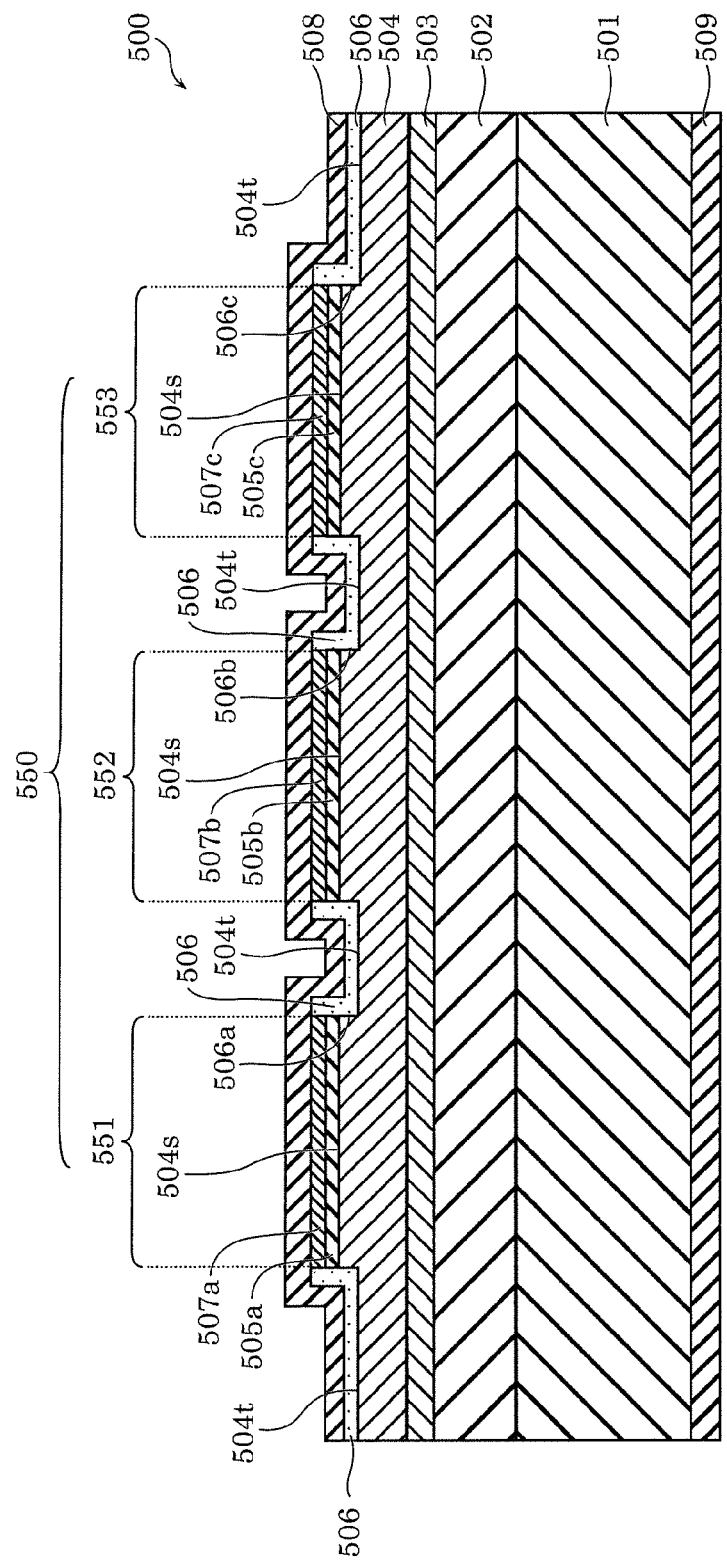
FIG. 12 is a schematic sectional view illustrating an overall configuration of a semiconductor light-emitting element according to Embodiment 5.

FIG. 12 is a sectional view schematically illustrating an overall configuration of semiconductor light-emitting element 500 according to the present embodiment. Semiconductor light-emitting element 500 according to the present embodiment is a semiconductor laser element which has two end surfaces forming a resonator. FIG. 12 illustrates a cross section perpendicular to the resonance direction of semiconductor light-emitting element 500.

As illustrated in FIG. 12, semiconductor light-emitting element 500 includes: substrate 501, insulating layer 506, n-side electrode 509, and array part 550 having three light-emitting element parts 551, 552, and 553 which are arrayed above a main surface of substrate 501 in parallel to the main surface and each of which emits light.

Light-emitting element parts 551, 552, and 553 each include: n-type cladding layer 502 formed of a nitride semiconductor, active layer 503 formed of a nitride semiconductor, p-type cladding layer 504 formed of a nitride semiconductor, and pad electrode 508, which are arranged in stated order from closest to furthest from substrate 501. Light-emitting element part 551 further includes contact layer 505a formed of a nitride semiconductor and p-side electrode 507a. Light-emitting element part 552 further includes contact layer 505b formed of a nitride semiconductor and p-side electrode 507b. Light-emitting element part 553 further includes contact layer 505c formed of a nitride semiconductor and p-side electrode 507c.

Substrate 501, n-type cladding layer 502, active layer 503, and n-side electrode 509 respectively have the same configurations as those of substrate 401, n-type cladding layer 402, active layer 403, and n-side electrode 409 according to Embodiment 4.

P-type cladding layer 504 is a cladding layer which is arranged above active layer 503 and formed of a p-type nitride semiconductor. In the present embodiment, p-type cladding layer 504 has: ridge parts 504s formed at positions corresponding to the respective light-emitting element parts; flat parts 504t formed on both sides of ridge parts 504s. P-type cladding layer 504 has: three ridge parts 504s which extend in the resonance direction of semiconductor light-emitting element 500; and portions with a small film thickness adjacent to three ridge parts 504s. Consequently, the light-emitting element parts of semiconductor light-emitting element 500 can provide stabilized intensity distribution in a direction along a cross section of output light, as is the case with semiconductor light-emitting element 200 according to Embodiment 2.

Figure 13:
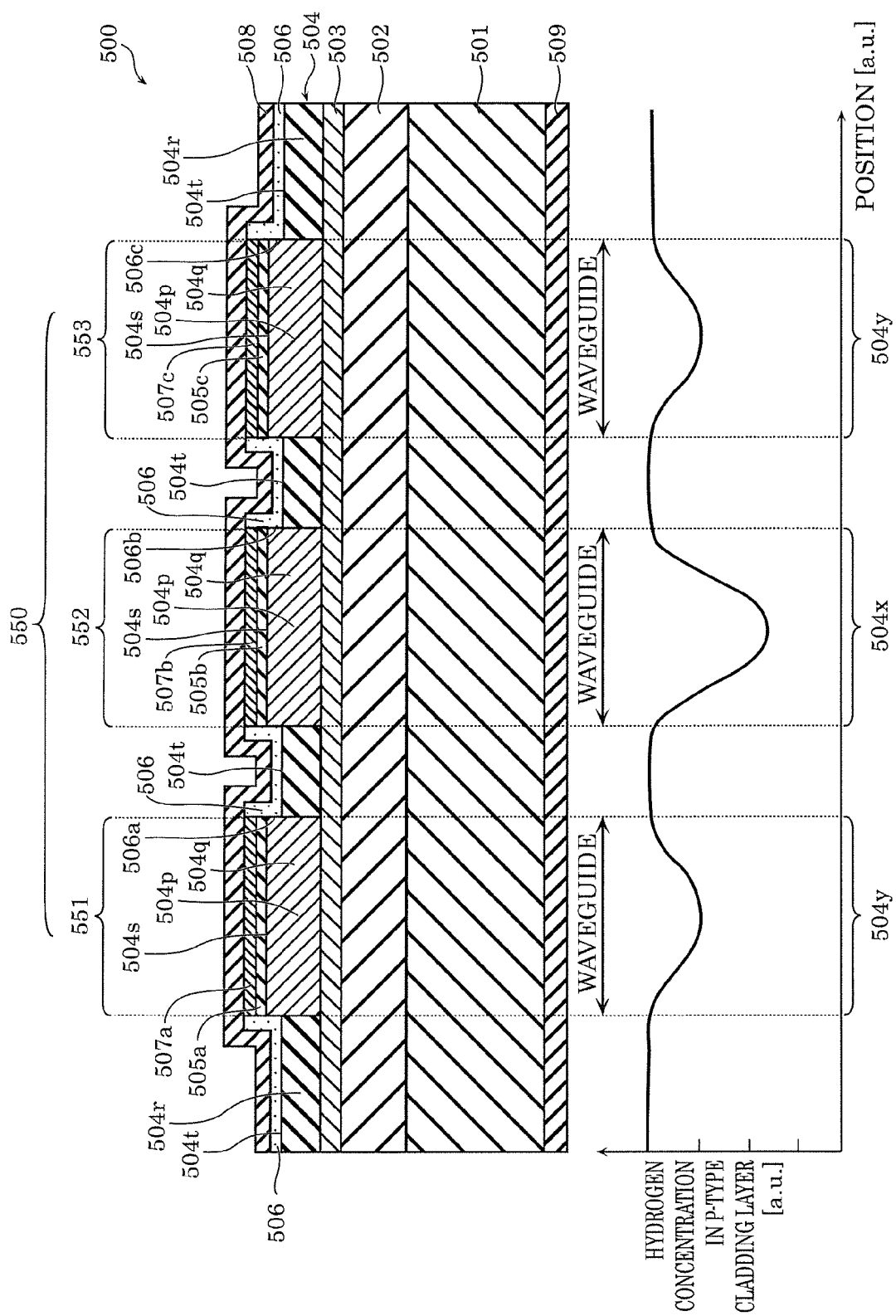
FIG. 13 is a graph schematically illustrating hydrogen concentration distribution of a p-type cladding layer according to Embodiment 5.

P-type cladding layer 504 contains hydrogen. The hydrogen concentration distribution of p-type cladding layer 504 will be described with reference to the drawing. FIG. 13 is a graph schematically illustrating the hydrogen concentration distribution of p-type cladding layer 504 according to the present embodiment. FIG. 13 also illustrates a schematic sectional view of semiconductor light-emitting element 500 for the purpose of indicating relationship between a position in p-type cladding layer 504 and the hydrogen concentration.

As illustrated in FIG. 13, the first concentration of the hydrogen at centers 504p of p-type cladding layer 504 in regions respectively below p-side electrodes 507a, 507b, and 507c is lower than the second concentration of the hydrogen at positions 504*q* of p-type cladding layer 504 located on sides closer to the outer edges than to the centers in the regions respectively below p-side electrodes 507*a*, 507*b*, and 507*c*. Moreover, the third concentration of the hydrogen in regions 504*r* of p-type cladding layer 504 other than the regions respectively below p-side electrodes 507*a*, 507*b*, and 507*c* is higher than the second concentration. That is, the third concentration of the hydrogen in regions 504*r* corresponding to the outside of waveguides of p-type cladding layer 504 is higher than the second concentration. Consequently, each of the light-emitting element parts of semiconductor light-emitting element 500 according to the present embodiment provides the same effect as the effect provided by semiconductor light-emitting element 100 according to Embodiment 1.

Moreover, as illustrated in FIG. 13, the hydrogen concentration in p-type cladding layer 504 of light-emitting element part 552 located on the side closer to the center of array part 550 is lower than the hydrogen concentration in p-type cladding layer 504 of light-emitting element parts 551 and 553 located on the sides closer to the end parts of array part 550 from light-emitting element part 552. That is, the hydrogen concentration in portion 504*x* of p-type cladding layer 504 included in light-emitting element part 552 located on the side closer to the center of array part 550 is lower than the hydrogen concentration in portions 504*y* of p-type cladding layer 504 included in light-emitting element parts 551 and 553 located on the sides closer to the end parts of array part 550. Consequently, semiconductor light-emitting element 500 according to the present embodiment provides the same effect as the effect provided by semiconductor light-emitting element 400 according to Embodiment 4.

Contact layers 505*a*, 505*b*, and 505*c* are layers which are arranged above p-type cladding layer 504 and formed of a p-type nitride semiconductor. Contact layers 505*a*, 505*b*, and 505*c* are arranged above ridge parts 504*s* of p-type cladding layer 504.

As described above, the structures of p-type cladding layer 504 and contact layers 505*a*, 505*b*, and 505*c* can be formed by the same method employed for p-type cladding layer 204 and contact layer 205 of semiconductor light-emitting element 200 according to Embodiment 2.

Insulating layer 506 is a layer which is arranged above p-type cladding layer 504 and formed of an insulating material having openings 506*a*, 506*b*, and 506*c*.

P-side electrodes 507*a*, 507*b*, and 507*c* are layers which are arranged above p-type cladding layer 504 and formed of a conductive material. P-side electrodes 507*a*, 507*b*, and 507*c* each have the same configuration as that of p-side electrode 207 according to Embodiment 2.

Pad electrode 508 is a layer which is arranged above p-side electrodes 507*a*, 507*b*, and 507*c* and formed of a conductive material. In the present embodiment, pad electrode 508 is arranged on each p-side electrode and insulating layer 506.

Note that p-side electrodes 507*a*, 507*b*, and 507*c* are formed with the same widths as those of openings 506*a*, 506*b*, and 506*c* in the present embodiment, but the p-side electrodes do not necessarily have the same widths as the widths of the openings and it is only required that at least part of the p-side electrodes may be arranged in the openings. For example, the p-side electrode may be wider than the width of the opening, in which case, a region located below a portion of the p-side electrode where the opening is arranged serves as "region below the p-side electrode" of the present invention. The same applies to the p-side electrodes and the regions below the p-side electrodes according to Embodiments 1 to 4.

Semiconductor light-emitting element 500 according to the present embodiment has the configuration as described above, thereby providing the same effect as the effects provided by the semiconductor light-emitting elements according to Embodiments 1 to 4, as described above.

Modified Embodiment, Etc.

The semiconductor light-emitting elements according to the present disclosure have been described above based on the embodiments, but the present disclosure is not limited to the embodiments described above.

For example, the embodiments have been described above, referring to an example in which the semiconductor light-emitting element is a semiconductor laser element, but the semiconductor light-emitting element is not limited to the semiconductor laser element. For example, the semiconductor light-emitting element may be a super luminescent diode.

Moreover, a ridge structure may be provided in semiconductor light-emitting element 300 according to Embodiment 3 as in semiconductor light-emitting element 200 according to Embodiment 2 described above.

Moreover, the number of light-emitting element parts of each semiconductor light-emitting element is three in Embodiments 4 and 5 described above, but the number of light-emitting element parts may be four or more.

Moreover, the semiconductor light-emitting elements respectively according to the embodiments described above include the insulating layers, but the semiconductor light-emitting elements do not necessarily include the insulating layers.

Moreover, the hydrogen concentration of the p-type cladding layer in the semiconductor light-emitting element according to each of the embodiments described above varies smoothly with respect to a position, but the hydrogen concentration distribution of the p-type cladding layer is not limited to such a configuration. For example, the hydrogen concentration distribution of the p-type cladding layer may vary in a stripe form with respect to a position.

Moreover, the present disclosure also includes: a mode obtained by making modifications conceivable by those skilled in the art to the embodiments; and a mode realized by combining the components and functions in the embodiments in a desired manner within a range not departing from the spirits of the present disclosure.

INDUSTRIAL APPLICABILITY

The semiconductor light-emitting element of the present disclosure is applicable to, for example, a projector or the like as a light source with high output and high efficiency.

The invention claimed is:
1. A semiconductor laser element, comprising:
an n-type cladding layer containing AlGaN;
an active layer which is arranged above the n-type cladding layer and contains InGaN;
a p-type cladding layer which is arranged above the active layer and has a laminated structure of a GaN layer and an AlGaN layer and a ridge part;
a p-side electrode arranged above the ridge part; and
an insulating layer which is arranged above the p-type cladding and has an opening;

wherein the p-type cladding layer contains magnesium and hydrogen, a width of the ridge part is 15 μm or more, the p-side electrode is arranged at least in the opening; and on a cross-section passing through the ridge part, in a region below the opening, the ridge part has a portion where a hydrogen concentration is $1 \times 10^{17}$ cm$^{-3}$ or more and $1 \times 10^{18}$ cm$^{-3}$ or less.

2. The semiconductor laser element according to claim 1, wherein a hydrogen concentration in the p-type cladding layer in a region below the p-side electrode is lower than a hydrogen concentration in the p-type cladding layer in a region other than the region below the p-side electrode.

3. The semiconductor laser element according to claim 2, wherein the region below the p-side electrode is a region located below a portion of the p-side electrode arranged in the opening.

4. The semiconductor laser element according to claim 3, further comprising:

a contact layer which is arranged above the p-type cladding layer and formed of a nitride semiconductor, wherein the insulating layer is arranged above the contact layer, and the p-side electrode is in contact with the contact layer in the opening.

5. The semiconductor laser element according to claim 3, wherein the opening is arranged above the ridge part, and the p-side electrode is arranged above the ridge part.

6. The semiconductor laser element according to claim 5, further comprising:

a contact layer which is arranged above the ridge part and formed of a nitride semiconductor, wherein the p-side electrode is in contact with the contact layer in the opening.

7. The semiconductor laser element according to claim 1, wherein the active layer has a layer containing GaN.

8. The semiconductor laser element according to claim 1, wherein the active layer has: one or more layers containing InGaN; and one or more layers containing GaN, and the one or more layers containing InGaN and the one or more layers containing GaN are alternately laminated.

9. The semiconductor laser element according to claim 1, wherein a width of the p-side electrode is 10 μm or more and 150 μm or less.

10. The semiconductor laser element according to claim 1, wherein as the ridge part, the p-type cladding layer has a plurality of ridge parts.

11. A semiconductor laser element, comprising:

a substrate; and an array part having three or more light-emitting element parts which are arrayed in parallel to a main surface of the substrate above the main surface and each of which emits light, wherein each of the three or more light-emitting element parts includes: on the substrate, an n-type cladding layer containing AlGaN, an active layer containing InGaN, and a p-type cladding layer formed arranged above the active layer and having a laminated structure of a GaN layer and an AlGaN layer, which are arranged in stated order from closest to furthest from the substrate, the p-type cladding layer contains magnesium and hydrogen, and a concentration of the hydrogen in the p-type cladding layer of the light-emitting element part included in the three or more light emitting element parts and located on a side closer to a center of the array part is lower than a concentration of the hydrogen in the p-type cladding layer of the light-emitting element part included in the three or more light emitting element parts and located on a side closer to an end part of the array part than the light-emitting element part included in the three or more light emitting element parts and located on the side closer to the center of the array part.

12. The semiconductor laser element according to claim 11, wherein the active layer has a layer containing GaN.

13. The semiconductor laser element according to claim 11, wherein the active layer has: one or more layers containing InGaN; and one or more layers containing GaN, and the one or more layers containing InGaN and the one or more layers containing GaN are alternately laminated.

14. The semiconductor laser element according to claim 11, wherein each of the three or more light-emitting parts further includes a p-side electrode disposed above the p-type cladding layer, and a width of the p-side electrode is 10 μm or more and 150 μm or less.

* * * * *